United States Patent
Melanson

(10) Patent No.: US 7,719,246 B2
(45) Date of Patent: May 18, 2010

(54) POWER CONTROL SYSTEM USING A NONLINEAR DELTA-SIGMA MODULATOR WITH NONLINEAR POWER CONVERSION PROCESS MODELING

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 257 days.

(21) Appl. No.: 11/967,269

(22) Filed: Dec. 31, 2007

(65) Prior Publication Data
US 2008/0272744 A1 Nov. 6, 2008

Related U.S. Application Data

(60) Provisional application No. 60/915,547, filed on May 2, 2007.

(51) Int. Cl.
*G05F 1/40* (2006.01)
(52) U.S. Cl. .................. 323/282; 323/283; 323/284
(58) Field of Classification Search .................. 323/222, 323/282–285, 288, 351
See application file for complete search history.

(56) References Cited

U.S. PATENT DOCUMENTS

| | | | |
|---|---|---|---|
| 4,414,493 A | 11/1983 | Henrich | |
| 4,677,366 A | 6/1987 | Wilkinson et al. | |
| 4,797,633 A | 1/1989 | Humphrey | |
| 4,940,929 A | 7/1990 | Williams | |
| 4,973,919 A | 11/1990 | Allfather | |
| 5,278,490 A | 1/1994 | Smedley | |
| 5,323,157 A | 6/1994 | Ledzius et al. | |
| 5,359,180 A | 10/1994 | Park et al. | |
| 5,477,481 A | 12/1995 | Kerth | |

(Continued)

FOREIGN PATENT DOCUMENTS

EP   0585789 A1   3/1994

(Continued)

OTHER PUBLICATIONS

Freescale Semiconductor, Inc., Dimmable Light Ballast with Power Factor Correction, Design Reference Manual, DRM067, Rev. 1, Dec. 2005.

(Continued)

*Primary Examiner*—Jessica Han
(74) *Attorney, Agent, or Firm*—Hamilton & Terrile, LLP; Kent B. Chambers

(57) ABSTRACT

A power control system includes a switching power converter and a power factor correction (PFC) and output voltage controller. The switching power converter utilizes a nonlinear energy transfer process to provide power to a load. The PFC and output voltage controller generates a control signal to control power factor correction and voltage regulation of the switching power converter. The PFC and output voltage controller includes a nonlinear delta-sigma modulator that models the nonlinear energy transfer process of the switching power converter. The nonlinear delta-sigma modulator generates an output signal used to determine the control signal. By using the nonlinear delta-sigma modulator in a control signal generation process, the PFC and output voltage controller generates a spectrally noise shaped control signal. In at least one embodiment, noise shaping of the control signal improves power factor correction and output voltage regulation relative to conventional systems.

21 Claims, 31 Drawing Sheets

U.S. PATENT DOCUMENTS

| | | | |
|---|---|---|---|
| 5,481,178 A | 1/1996 | Wilcox et al. | |
| 5,565,761 A | 10/1996 | Hwang | |
| 5,747,977 A | 5/1998 | Hwang | |
| 5,783,909 A | 7/1998 | Hochstein | |
| 5,963,086 A | 10/1999 | Hall | |
| 5,994,885 A | 11/1999 | Wilcox et al. | |
| 6,016,038 A | 1/2000 | Mueller et al. | |
| 6,043,633 A | 3/2000 | Lev et al. | |
| 6,072,969 A | 6/2000 | Yokomori et al. | |
| 6,083,276 A | 7/2000 | Davidson et al. | |
| 6,084,450 A | 7/2000 | Smith et al. | |
| 6,150,774 A | 11/2000 | Mueller et al. | |
| 6,211,626 B1 | 4/2001 | Lys et al. | |
| 6,211,627 B1 | 4/2001 | Callahan | |
| 6,229,271 B1 | 5/2001 | Liu | |
| 6,246,183 B1 | 6/2001 | Buonavita | |
| 6,259,614 B1 | 7/2001 | Ribarich et al. | |
| 6,304,066 B1 | 10/2001 | Wilcox et al. | |
| 6,304,473 B1 | 10/2001 | Telefus et al. | |
| 6,344,811 B1 | 2/2002 | Melanson | |
| 6,445,600 B2 | 9/2002 | Ben-Yaakov | |
| 6,452,521 B1 | 9/2002 | Wang | |
| 6,509,913 B2 | 1/2003 | Martin, Jr. et al. | |
| 6,580,258 B2 | 6/2003 | Wilcox et al. | |
| 6,583,550 B2 | 6/2003 | Iwasa et al. | |
| 6,636,003 B2 | 10/2003 | Rahm et al. | |
| 6,690,594 B2 * | 2/2004 | Amarillas et al. | 363/124 |
| 6,713,974 B2 | 3/2004 | Patchornik et al. | |
| 6,727,832 B1 | 4/2004 | Melanson | |
| 6,741,123 B1 | 5/2004 | Anderson et al. | |
| 6,768,655 B1 | 7/2004 | Yang et al. | |
| 6,781,351 B2 | 8/2004 | Mednik et al. | |
| 6,788,011 B2 | 9/2004 | Mueller et al. | |
| 6,806,659 B1 | 10/2004 | Mueller et al. | |
| 6,839,247 B1 | 1/2005 | Yang | |
| 6,860,628 B2 | 3/2005 | Robertson et al. | |
| 6,870,325 B2 | 3/2005 | Bushell et al. | |
| 6,882,552 B2 | 4/2005 | Telefus et al. | |
| 6,888,322 B2 | 5/2005 | Dowling et al. | |
| 6,933,706 B2 | 8/2005 | Shih | |
| 6,940,733 B2 | 9/2005 | Schie et al. | |
| 6,944,034 B1 | 9/2005 | Shytenberg et al. | |
| 6,956,750 B1 | 10/2005 | Eason et al. | |
| 6,967,448 B2 | 11/2005 | Morgan et al. | |
| 6,970,503 B1 | 11/2005 | Kalb | |
| 6,975,079 B2 | 12/2005 | Lys et al. | |
| 7,064,498 B2 | 6/2006 | Dowling et al. | |
| 7,064,531 B1 | 6/2006 | Zinn | |
| 7,088,059 B2 | 8/2006 | McKinney et al. | |
| 7,102,902 B1 | 9/2006 | Brown et al. | |
| 7,109,791 B1 | 9/2006 | Epperson et al. | |
| 7,135,824 B2 | 11/2006 | Lys et al. | |
| 7,145,295 B1 | 12/2006 | Lee et al. | |
| 7,161,816 B2 | 1/2007 | Shytenberg et al. | |
| 7,183,957 B1 | 2/2007 | Melanson | |
| 7,221,130 B2 | 5/2007 | Ribeiro et al. | |
| 7,255,457 B2 | 8/2007 | Ducharm et al. | |
| 7,266,001 B1 | 9/2007 | Notohamiprodjo et al. | |
| 7,288,902 B1 | 10/2007 | Melanson | |
| 7,292,013 B1 | 11/2007 | Chen et al. | |
| 2002/0145041 A1 | 10/2002 | Muthu et al. | |
| 2002/0166073 A1 | 11/2002 | Nguyen et al. | |
| 2003/0095013 A1 | 5/2003 | Melanson et al. | |
| 2003/0223255 A1 | 12/2003 | Ben-Yaakov | |
| 2004/0085030 A1 | 5/2004 | Laflamme et al. | |
| 2004/0085117 A1 | 5/2004 | Melbert et al. | |
| 2004/0169477 A1 | 9/2004 | Yanai et al. | |
| 2004/0227571 A1 | 11/2004 | Kuribayashi | |
| 2004/0228116 A1 | 11/2004 | Miller et al. | |
| 2004/0239262 A1 | 12/2004 | Ido et al. | |
| 2005/0057237 A1 | 3/2005 | Clavel | |
| 2005/0156770 A1 | 7/2005 | Melanson | |
| 2005/0184895 A1 | 8/2005 | Petersen et al. | |
| 2005/0253533 A1 | 11/2005 | Lys et al. | |
| 2005/0275354 A1 | 12/2005 | Hausman, Jr. et al. | |
| 2006/0022916 A1 | 2/2006 | Aiello | |
| 2006/0023002 A1 | 2/2006 | Hara et al. | |
| 2006/0125420 A1 | 6/2006 | Boone et al. | |
| 2006/0145670 A1 * | 7/2006 | Zhou et al. | 323/222 |
| 2006/0226795 A1 | 10/2006 | Walter et al. | |
| 2006/0261754 A1 | 11/2006 | Lee | |
| 2007/0029946 A1 | 2/2007 | Yu et al. | |
| 2007/0040512 A1 | 2/2007 | Jungwirth et al. | |
| 2007/0053182 A1 | 3/2007 | Robertson | |
| 2007/0103949 A1 | 5/2007 | Tsuruya | |
| 2007/0182699 A1 | 8/2007 | Ha et al. | |
| 2008/0174372 A1 | 7/2008 | Tucker et al. | |
| 2008/0224635 A1 | 9/2008 | Hayes | |

FOREIGN PATENT DOCUMENTS

| | | |
|---|---|---|
| EP | 0910168 A1 | 4/1999 |
| EP | 1014563 | 6/2000 |
| EP | 1164819 A | 12/2001 |
| EP | 1213823 A2 | 6/2002 |
| EP | 1528785 A | 5/2005 |
| WO | 01/97384 A | 12/2001 |
| WO | 0227944 | 4/2002 |
| WO | 02/091805 A2 | 11/2002 |
| WO | WO 2006/022107 A2 | 3/2006 |
| WO | 2006/067521 A | 6/2006 |
| WO | WO2006135584 | 12/2006 |
| WO | 2007/026170 A | 3/2007 |
| WO | 2007/079362 A | 7/2007 |

OTHER PUBLICATIONS

J. Zhou et al., Novel Sampling Algorithm for DSP Controlled 2 kW PFC Converter, IEEE Transactions on Power Electronics, vol. 16, No. 2, Mar. 2001.

A. Prodic, Compensator Design and Stability Assessment for Fast Voltage Loops of Power Factor Correction Rectifiers, IEEE Transactions on Power Electronics, vol. 22, No. 5, Sep. 2007.

M. Brkovic et al., "Automatic Current Shaper with Fast Output Regulation and Soft-Switching," S.15.C Power Converters, Telecommunications Energy Conference, 1993.

Dallas Semiconductor, Maxim, "Charge-Pump and Step-Up DC-DC Converter Solutions for Powering White LEDs in Series or Parallel Connections," Apr. 23, 2002.

Freescale Semiconductor, AN3052, Implementing PFC Average Current Mode Control Using the MC9S12E128, Nov. 2005.

D. Maksimovic et al., "Switching Converters with Wide DC Conversion Range," Institute of Electrical and Electronic Engineer's (IEEE) Transactions on Power Electronics, Jan. 1991.

V. Nguyen et al., "Tracking Control of Buck Converter Using Sliding-Mode with Adaptive Hysteresis," Power Electronics Specialists Conference, 1995. PESC apos; 95 Record., 26th Annual IEEE vol. 2, Issue , Jun. 18-22, 1995 pp. 1086-1093.

S. Zhou et al., "A High Efficiency, Soft Switching DC-DC Converter with Adaptive Current-Ripple Control for Portable Applications," IEEE Transactions on Circuits and Systems—II: Express Briefs, vol. 53, No. 4, Apr. 2006.

K. Leung et al., "Use of State Trajectory Prediction in Hysteresis Control for Achieving Fast Transient Response of the Buck Converter," Circuits and Systems, 2003. ISCAS apos;03. Proceedings of the 2003 International Symposium, vol. 3, Issue , May 25-28, 2003 pp. III-439-III-442 vol. 3.

K. Leung et al., "Dynamic Hysteresis Band Control of the Buck Converter with Fast Transient Response," IEEE Transactions on Circuits and Systems—II: Express Briefs, vol. 52, No. 7, Jul. 2005.

Y. Ohno, Spectral Design Considerations for White LED Color Rendering, Final Manuscript, Optical Engineering, vol. 44, 111302 (2005).

S. Skogstad et al., A Proposed Stability Characterization and Verification Method for High-Order Single-Bit Delta-Sigma Modulators, Norchip Conference, Nov. 2006 http://folk.uio.no/savskogs/pub/A_Proposed_Stability_Characterization.pdf.

J. Turchi, Four Key Steps to Design a Continuous Conduction Mode PFC Stage Using the NCP1653, ON Semiconductor, Publication Order No. AND184/D, Nov. 2004.

Megaman, D or S Dimming ESL, Product News, Mar. 15, 2007.

J. Qian et al., New Charge Pump Power-Factor-Correction Electronic Ballast with a Wide Range of Line Input Voltage, IEEE Transactions on Power Electronics, vol. 14, No. 1, Jan. 1999.

P. Green, A Ballast that can be Dimmed from a Domestic (Phase-Cut) Dimmer, IRPLCFL3 rev. b, International Rectifier, http://www.irf.com/technical-info/refdesigns/cfl-3.pdf, printed Mar. 24, 2007.

J. Qian et al., Charge Pump Power-Factor-Correction Technologies Part II: Ballast Applications, IEEE Transactions on Power Electronics, vol. 15, No. 1, Jan. 2000.

Chromacity Shifts in High-Power White LED Systems due to Different Dimming Methods, Solid-State Lighting, http://www.lrcrpi.edu/programs/solidstate/completedProjects.asp?ID=76, printed May 3, 2007.

S. Chan et al., Design and Implementation of Dimmable Electronic Ballast Based on Integrated Inductor, IEEE Transactions on Power Electronics, vol. 22, No. 1, Jan. 2007.

M. Madigan et al., Integrated High-Quality Rectifier-Regulators, IEEE Transactions on Industrial Electronics, vol. 46, No. 4, Aug. 1999.

T. Wu et al., Single-Stage Electronic Ballast with Dimming Feature and Unity Power Factor, IEEE Transactions on Power Electronics, vol. 13, No. 3, May 1998.

F. Tao et al., "Single-Stage Power-Factor-Correction Electronic Ballast with a Wide Continuous Dimming Control for Fluorescent Lamps," IEEE Power Electronics Specialists Conference, vol. 2, 2001.

Azoteq, IQS17 Family, IQ Switch®—ProxSense™ Series, Touch Sensor, Load Control and User Interface, IQS17 Datasheet V2.00.doc, Jan. 2007.

C. Dilouie, Introducing the LED Driver, EC&M, Sep. 2004.

S. Lee et al., TRIAC Dimmable Ballast with Power Equalization, IEEE Transactions on Power Electronics, vol. 20, No. 6, Nov. 2005.

L. Gonthier et al., EN55015 Compliant 500W Dimmer with Low-Losses Symmetrical Switches, 2005 European Conference on Power Electronics and Applications, Sep. 2005.

Why Different Dimming Ranges? The Difference Between Measured and Perceived Light, http://www.lutron.com/ballast/pdf/LutronBallastpg3.pdf.

D. Hausman, Real-Time Illumination Stability Systems for Trailing-Edge (Reverse Phase Control) Dimmers, Technical White Paper, Lutron, version 1.0, Dec. 2004, http://www.lutron.com/technical_info/pdf/RTISS-TE.pdf.

Light Dimmer Circuits, www.epanorama.net/documents/lights/lightdimmer.html, printed Mar. 26, 2007.

Light Emitting Diode, http://en.wikipedia.org/wiki/Light-emitting_diode, printed Mar. 27, 2007.

Color Temperature, www.sizes.com/units/color_temperature.htm, printed Mar. 27, 2007.

S. Lee et al., A Novel Electrode Power Profiler for Dimmable Ballasts Using DC Link Voltage and Switching Frequency Controls, IEEE Transactions on Power Electronics, vol. 19, No. 3, May 2004.

Y. Ji et al., Compatibility Testing of Fluorescent Lamp and Ballast Systems, IEEE Transactions on Industry Applications, vol. 35, No. 6, Nov./Dec. 1999.

National Lighting Product Information Program, Specifier Reports, "Dimming Electronic Ballasts," vol. 7, No. 3, Oct. 1999.

Supertex Inc., Buck-based LED Drivers Using the HV9910B, Application Note AN-H48, Dec. 28, 2007.

D. Rand et al., Issues, Models and Solutions for Triac Modulated Phase Dimming of LED Lamps, Power Electronics Specialists Conference, 2007.

Supertex Inc., HV9931 Unity Power Factor LED Lamp Driver, Application Note AN-H52, Mar. 7, 2007.

Supertex Inc., 56W Off-line LED Driver, 120VAC with PFC, 160V, 350mA Load, Dimmer Switch Compatible, DN-H05, Feb. 2007.

ST Microelectronics, Power Factor Corrector L6561, Jun. 2004.

Fairchild Semiconductor, Application Note 42047 Power Factor Correction (PFC) Basics, Rev. 0.9.0 Aug. 19, 2004

M. Radecker et al., Application of Single-Transistor Smart-Power IC for Fluorescent Lamp Ballast, Thirty-Fourth Annual Industry Applications Conference IEEE, vol. 1, Oct. 3, 1999-Oct. 7, 1999.

M. Rico-Secades et al., Low Cost Electronic Ballast for a 36-W Fluorescent Lamp Based on a Current-Mode-Controlled Boost Inverter for a 120-V DC Bus Power Distribution, IEEE Transactions on Power Electronics, vol. 21, No. 4, Jul. 2006.

Fairchild Semiconductor, FAN4800, Low Start-up Current PFC/PWM Controller Combos, Nov. 2006.

Fairchild Semiconductor, FAN4810, Power Factor Correction Controller, Sep. 24, 2003.

Fairchild Semiconductor, FAN4822, ZVS Average Current PFC Controller, Aug. 10, 2001.

Fairchild Semiconductor, FAN7527B, Power Factor Correction Controller, 2003.

Fairchild Semiconductor, ML4821, Power Factor Controller, Jun. 19, 2001.

Freescale Semiconductor, AN1965, Design of Indirect Power Factor Correction Using 56F800/E, Jul. 2005.

International Search Report for PCT/US2008/051072, mailed Jun. 4, 2008.

Infineon, CCM-PFC Standalone Power Factor Correction (PFC) Controller in Continuous Conduction Mode (CCM), Version 2.1, Feb. 6, 2007.

International Rectifier, IRAC1150-300W Demo Board, User's Guide, Rev 3.0, Aug. 2, 2005.

International Rectifier, Application Note AN-1077,PFC Converter Design with IR1150 One Cycle Control IC, rev. 2.3, Jun. 2005.

International Rectifier, Data Sheet PD60230 revC, Feb. 5, 2007.

Lu et al, International Rectifier, Bridgeless PFC Implementation Using One Cycle Control Technique, 2005.

Linear Technology, LT1248, Power Factor Controller, Apr. 20, 2007.

ON Semiconductor, AND8123/D, Power Factor Correction Stages Operating in Critical Conduction Mode, Sep. 2003.

ON Semiconductor, MC33260, GreenLine Compact Power Factor Controller: Innovative Circuit for Cost Effective Solutions, Sep. 2005.

ON Semiconductor, NCP1605, Enhanced, High Voltage and Efficient Standby Mode, Power Factor Controller, Feb. 2007.

ON Semconductor, NCP1606, Cost Effective Power Factor Controller, Mar. 2007.

ON Semiconductor, NCP1654, Product Review, Power Factor Controller for Compact and Robust, Continuous Conduction Mode Pre-Converters, Mar. 2007.

Philips, Application Note, 90W Resonant SMPS with TEA1610 SwingChip, AN99011, 1999.

NXP, TEA1750, GreenChip III SMPS control IC Product Data Sheet, Apr. 6, 2007.

Renesas, HA16174P/FP, Power Factor Correction Controller IC, Jan. 6, 2006.

Renesas Technology Releases Industry's First Critical-Conduction-Mode Power Factor Correction Control IC Implementing Interleaved Operation, Dec. 18, 2006.

Renesas, Application Note R2A20111 EVB, PFC Control IC R2A20111 Evaluation Board, Feb. 2007.

STMicroelectronics, L6563, Advanced Transition-Mode PFC Controller, Mar. 2007.

Texas Instruments, Application Note SLUA321, Startup Current Transient of the Leading Edge Triggered PFC Controllers, Jul. 2004.

Texas Instruments, Application Report, SLUA309A, Avoiding Audible Noise at Light Loads when using Leading Edge Triggered PFC Converters, Sep. 2004.

Texas Instruments, Application Report SLUA369B, 350-W, Two-Phase Interleaved PFC Pre-Regulator Design Review, Mar. 2007.

Unitrode, High Power-Factor Preregulator, Oct. 1994.

Texas Instruments, Transition Mode PFC Controller, SLUS515D, Jul. 2005.

Unitrode Products From Texas Instruments, Programmable Output Power Factor Preregulator, Dec. 2004.

Unitrode Products From Texas Instruments, High Performance Power Factor Preregulator, Oct. 2005.

Texas Instruments, UCC3817 BiCMOS Power Factor Preregulator Evaluation Board User's Guide, Nov. 2002.

Unitrode, L. Balogh, Design Note UC3854A/B and UC3855A/B Provide Power Limiting with Sinusoidal Input Current for PFC Front Ends, SLUA196A, Nov. 2001.

A. Silva De Morais et al., A High Power Factor Ballast Using a Single Switch with Both Power Stages Integrated, IEEE Transactions on Power Electronics, vol. 21, No. 2, Mar. 2006.

M. Ponce et al., High-Efficient Integrated Electronic Ballast for Compact Fluorescent Lamps, IEEE Transactions on Power Electronics, vol. 21, No. 2, Mar. 2006.

A. R. Seidel et al., A Practical Comparison Among High-Power-Factor Electronic Ballasts with Similar Ideas, IEEE Transactions on Industry Applications, vol. 41, No. 6, Nov.-Dec. 2005.

F. T. Wakabayashi et al., An Improved Design Procedure for LCC Resonant Filter of Dimmable Electronic Ballasts for Fluorescent Lamps, Based on Lamp Model, IEEE Transactions on Power Electronics, vol. 20, No. 2, Sep. 2005.

J. A. Vilela Jr. et al., An Electronic Ballast with High Power Factor and Low Voltage Stress, IEEE Transactions on Industry Applications, vol. 41, No. 4, Jul./Aug. 2005.

S. T.S. Lee et al., Use of Saturable Inductor to Improve the Dimming Characteristics of Frequency-Controlled Dimmable Electronic Ballasts, IEEE Transactions on Power Electronics, vol. 19, No. 6, Nov. 2004.

M. K. Kazimierczuk et al., Electronic Ballast for Fluorescent Lamps, IEEE Transactions on Power Electronics, vol. 8, No. 4, Oct. 1993.

S. Ben-Yaakov et al., Statics and Dynamics of Fluorescent Lamps Operating at High Frequency: Modeling and Simulation, IEEE Transactions on Industry Applications, vol. 38, No. 6, Nov.-Dec. 2002.

H. L. Cheng et al., A Novel Single-Stage High-Power-Factor Electronic Ballast with Symmetrical Topology, IEEE Transactions on Power Electronics, vol. 50, No. 4, Aug. 2003.

J.W.F. Dorleijn et al., Standardisation of the Static Resistances of Fluorescent Lamp Cathodes and New Data for Preheating, Industry Applications Conference, vol. 1, Oct. 13, 2002-Oct. 18, 2002.

Q. Li et al., An Analysis of the ZVS Two-Inductor Boost Converter under Variable Frequency Operation, IEEE Transactions on Power Electronics, vol. 22, No. 1, Jan. 2007.

H. Peng et al., Modeling of Quantization Effects in Digitally Controlled DC-DC Converters, IEEE Transactions on Power Electronics, vol. 22, No. 1, Jan. 2007.

G. Yao et al., Soft Switching Circuit for Interleaved Boost Converters, IEEE Transactions on Power Electronics, vol. 22, No. 1, Jan. 2007.

C. M. De Oliviera Stein et al., A ZCT Auxiliary Communication Circuit for Interleaved Boost Converters Operating in Critical Conduction Mode, IEEE Transactions on Power Electronics, vol. 17, No. 6, Nov. 2002.

W. Zhang et al., A New Duty Cycle Control Strategy for Power Factor Correction and FPGA Implementation, IEEE Transactions on Power Electronics, vol. 21, No. 6, Nov. 2006.

H. Wu et al., Single Phase Three-Level Power Factor Correction Circuit with Passive Lossless Snubber, IEEE Transactions on Power Electronics, vol. 17, No. 2, Mar. 2006.

O. Garcia et al., High Efficiency PFC Converter to Meet EN61000-3-2 AND A14, Proceedings of the 2002 IEEE International Symposium on Industrial Electronics, vol. 3, 2002.

P. Lee et al., Steady-State Analysis of an Interleaved Boost Converter with Coupled Inductors, IEEE Transactions on Industrial Electronics, vol. 47, No. 4, Aug. 2000.

D.K.W. Cheng et al., A New Improved Boost Converter with Ripple Free Input Current Using Coupled Inductors, Power Electronics and Variable Speed Drives, Sep. 21-23, 1998.

B.A. Miwa et al., High Efficiency Power Factor Correction Using Interleaved Techniques, Applied Power Electronics Conference and Exposition, Seventh Annual Conference Proceedings, Feb. 23-27, 1992.

Z. Lai et al., A Family of Power-Factor-Correction Controllers, Twelfth Annual Applied Power Electronics Conference and Exposition, vol. 1, Feb. 23, 1997-Feb. 27, 1997.

L. Balogh et al., Power-Factor Correction with Interleaved Boost Converters in Continuous-Inductor-Current Mode, Eighth Annual Applied Power Electronics Conference and Exposition, 1993. APEC '93. Conference Proceedings, Mar. 7, 1993-Mar. 11, 1993.

Fairchild Semiconductor, Application Note 42030, Theory and Application of the ML4821 Average Current Mode PFC Controller, Oct. 25, 2000.

Unitrode Products From Texas Instruments, BiCMOS Power Factor Preregulator, Feb. 2006.

D. Hausman, Lutron, RTISS-TE Operation, Real-Time Illumination Stability Systems for Trailing-Edge (Reverse Phase Control) Dimmers, v. 1.0 Dec. 2004.

International Rectifier, Data Sheet No. PD60230 revC, IR1150(S)(PbF), uPFC One Cycle Control PFC IC Feb. 5, 2007.

Texas Instruments, Application Report SLUA308, UCC3817 Current Sense Transformer Evaluation, Feb. 2004.

Texas Instruments, Application Report SPRA902A, Average Current Mode Controlled Power Factor Correctiom Converter using TMS320LF2407A, Jul. 2005.

Unitrode, Design Note DN-39E, Optimizing Performance in UC3854 Power Factor Correction Applications, Nov. 1994.

Fairchild Semiconductor, Application Note 42030, Theory and Application of the ML4821 Average Currrent Mode PFC Controller, Aug. 1997.

Fairchild Semiconductor, Application Note AN4121, Design of Power Factor Correction Circuit Using FAN7527B, Rev.1.0.1, May 30, 2002.

Fairchild Semiconductor, Application Note 6004, 500W Power-Factor-Corrected (PFC) Converter Design with FAN4810, Rev. 1.0.1, Oct. 31, 2003.

Fairchild Semiconductor, FAN4822, ZVA Average Current PFC Controller, Rev. 1.0.1 Aug. 10, 2001.

Fairchild Semiconductor, ML4821, Power Factor Controller, Rev. 1.0.2, Jun. 19, 2001.

Fairchild Semiconductor, ML4812, Power Factor Controller, Rev. 1.0.4, May 31, 2001.

Linear Technology, 100 Watt LED Driver, undated.

Fairchild Semiconductor, FAN7544, Simple Ballast Controller, Rev. 1.0.0.

Fairchild Semiconductor, FAN7532, Ballast Controller, Rev. 1.0.2.

Fairchild Semiconductor, FAN7711, Ballast Control IC, Rev. 1.0.2.

Fairchild Semiconductor, KA7541, Simple Ballast Controller, Rev. 1.0.3.

ST Microelectronics, L6574, CFL/TL Ballast Driver Preheat and Dimming, Sep. 2003.

ST Microelectronics, AN993, Application Note, Electronic Ballast with PFC Using L6574 and L6561, May 2004.

International Search Report and Written Opinion for PCT/US2008/062384 dated Jan. 14, 2008.

S. Dunlap et al., Design of Delta-Sigma Modulated Switching Power Supply, Circuits & Systems, Proceedings of the 1998 IEEE International Symposium, 1998.

Power Integrations, Inc., "TOP200-4/14 TOPSwitch Family Three-terminal Off-line PWM Switch", XP-002524650, Jul. 1996, Sunnyvale, California.

Texas Instruments, SLOS318F, "High-Speed, Low Noise, Fully-Differential I/O Amplifiers," THS4130 and THS4131, US, Jan. 2006.

International Search Report and Written Opinion, PCT US20080062387, dated Feb. 5, 2008.

International Search Report and Written Opinion, PCT US200900032358, dated Jan. 29, 2009.

International Search Report and Written Report PCT US20080062428 dated Feb. 5, 2008.

Prodic, A. et al, Dead Zone Digital Controller for Improved Dynamic Response of Power Factor Preregulators, IEEE, US, 2003.

Burr-Brown, ISO130, "High IMR, Low Cost Isolation Amplifier," SBOS220, US, Oct. 2001.

International Search Report and Written Opinion, PCT US20090032351, dated Jan. 29, 2009.

Erickson, Robert W. et al, "Fundamentals of Power Electronics," Second Edition, Chapter 6, Boulder, CO, 2001.

Allegro Microsystems, A1442, "Low Voltage Full Bridge Brushless DC Motor Driver with Hall Commutation and Soft-Switching, and Reverse Battery, Short Circuit, and Thermal Shutdown Protection," Worcester MA, 2009.

Texas Instruments, SLUS828B, "8-Pin Continuous Conduction Mode (CCM) PFC Controller", UCC28019A, US, revised Apr. 2009.
Analog Devices, "120 kHz Bandwidth, Low Distortion, Isolation Amplifier", AD215, Norwood, MA, 1996.
Burr-Brown, ISO120 and ISO121, "Precision Los Cost Isolation Amplifier," Tucson AZ, Mar. 1992.
"HV9931 Unity Power Factor LED Lamp Driver, Initial Release", Supertex Inc., Sunnyvale, CA USA 2005.
AN-H52 Application Note: "HV9931 Unity Power Factor LED Lamp Driver" Mar. 7, 2007, Supertex Inc., Sunnyvale, CA, USA.
Dustin Rand et al: "Issues, Models and Solutions for Triac Modulated Phase Dimming of LED Lamps" Power Electronics Specialists Conferrence, 2007. PESC 2007. IEEE, IEEE, P1, Jun. 1, 2007, pp. 1398-1404.
Spiazzi G et al: "Analysis of a High-Power Factor Electronic Ballast for High Brightness Light Emitting Diodes" Power Electronics Specialists, 2005 IEEE 36TH Conference on Jun. 12, 2005, Piscatawa, NJ, USA, IEEE, Jun. 12, 2005, pp. 1494-1499.
International Search Report PCT/US2008/062381 dated Feb. 5, 2008.
International Search Report PCT/US2008/056739 dated Dec. 3, 2008.
Written Opinion of the International Searching Authority PCT/US2008/062381 dated Feb. 5, 2008.
Ben-Yaakov et al, "The Dynamics of a PWM Boost Converter with Resistive Input" IEEE Transactions on Industrial Electronics, IEEE Service Center, Piscataway, NJ, USA, vol. 46, No. 3, Jun. 1, 1999.
International Search Report PCT/US2008/062398 dated Feb. 5, 2008.
Partial International Search Report PCT/US2008/062387 dated Feb. 5, 2008.
Noon, Jim "UC3855A/B High Performance Power Factor Preregulator", Texas Instruments, SLUA146A, May 1996, Revised Apr. 2004.
International Search Report PCT/GB2006/003259 dated Jan. 12, 2007.
Written Opinion of the International Searching Authority PCT/US2008/056739 dated Dec. 3, 2008.
International Search Report PCT/US2008/056606 dated Dec. 3, 2008.
Written Opinion of the International Searching Authority PCT/US2008/056606 dated Dec. 3, 2008.
International Search Report PCT/US2008/056608 dated Dec. 3, 2008.
Written Opinion of the International Searching Authority PCT/US2008/056608 dated Dec. 3, 2008.
International Search Report PCT/GB2005/050228 dated Mar. 14, 2006.
International Search Report PCT/US2008/062387 dated Jan. 10, 2008.
Data Sheet LT3496 Triple Output LED Driver, Linear Technology Corporation, Milpitas, CA 2007.
Linear Technology, News Release,Triple Output LED, LT3496, Linear Technology, Milpitas, CA, May 24, 2007.

* cited by examiner

```
(* Emulation of boost DCM PFC
  John Melanson
  Copyright Cirrus Logic
  3 July 2007

The PFC control uses trailing edge control, open loop timing
*)

(*sample rate*) fs = 2.10^6; ts = 1./fs;
  (*      simulation length    *) len = 2^17;
  win = .5 (1. - Cos[2. Pi * Range[len] / len]);
  freqax = Range[len/2] / len * fs;
  Print["total simulated time = ", len*ts, " seconds"];
  total simulated time = 0.065536 seconds widespect[x_, fs_] := (* Plot the broadband spectrum, averaged*)
    Module[{pow = Table[0, {513}], num, X, win, fax, sc},
      win = .5 (1 - Cos[Range[1024] (2. Pi/1024)]);
      fax = Range[0, 512] / 1024. * fs;
      num = Floor[Length[x] / 512] - 1;
      Do[X = Take[Fourier[Take[x, {1, 1024} + i * 512] * win], 513];
        pow += Re[X]^2 + Im[X]^2;
        , {i, 0, num - 1}];
      sc = 1 / Total[Take[pow, 5]];
      pow = 10 Log[10, sc * pow];
      ListPlot[Transpose[{fax, pow}],
        PlotRange -> {All, {-70, -10}}, PlotJoined -> True, GridLines -> Automatic, ImageSize -> 72 * 6];
    ];

lowspect[x_, fs_, ftop_] := (* plot the low frequency spectrum for line harmonics *)
    Module[{X, bins},
      bins = Floor[Length[x] * ftop / fs + 1];
      X = Take[Fourier[win * x], bins];
      X = Re[X]^2 + Im[X]^2; X = X / Total[X];
      ListPlot[10 Log[10, X], PlotRange -> All, PlotJoined -> True, GridLines -> Automatic];
    ];
```

Figure 9

```
(* PFC simulation*)
runjlmpfc[vin_, fin_, initcap_, vmin_] := Module[
  {w1 = 2. Pi fin / fs, sw, ontime, i1, state = {}, timer = 0, vpk, nswitch, fber, vline,
    vc1 = initcap, pw = 0, pws = {},
    t1 = 10., tt = 0., t1hist = {}, t2hist = {}, tthist = {}, ihist = {}, k1, k2, ks, pinsc,
    dsa0 = 0., dsb0 = 0.,
    dsscale = 2^2, kscale = 2^5, pscale = 2^12},
  sw = False; offtime = 0; nxtime = 0; i1 = 0.; vpk = vin Sqrt[2.];
  minperiod = 20; maxperiod = 100;
  nswitch = 0; fber = 0.; vline = 0.;
  k1 = 2 L1 / ts * pmax / vmin^2; k2 = (vmin / vin) ^ 2; Print["k1= ", k1, " k2= ", k2];
  ks = Floor[.5 + kscale * k1 * k2]; pinsc = pin * pscale;
  Do[
(*update "spice" part. Calulates new currents and voltages, trapaziodal aproximation *)
vx = Abs[vline];
oldi1 = i1; i1 = Max[0, i1 + If[sw, vx ts / L1, (vx - vc1) ts / L1]];
vc1 += ts / C1 * (If[sw, 0, .5 (i1 + oldi1)] - pout[[t]] / vc1);

(*look for 0 crossing to update outer fb loop *)

oldvline = vline; vline = vpk Sin[w1 t];
If[oldvline * vline < 0,
  oldfber = fber; fber = 1. - vc1 / vtarget;
  (*pin=pin+4 fber +16 (fber-oldfber);pinsc=pin*pscale;*)
  pinsc = pinsc + Floor[.5 + (4 fber + 16 (fber - oldfber)) * pscale];
  If[True, Print["voltage error = ", fber, "  control signal = ", pinsc]];
];

(*simulate switch control*)

If[sw,
  If[t ≥ offtime, sw = False; ihist = {ihist, i1};];
  ,
  If[t ≥ nxtime,
    (*                RT MATH calculations here               *)
```

Figure 10

```
sw = True; nswitch += 1;
   dsin = Min[maxperiod, minperiod * If[pin > .5, (2. - pinsc/pscale), 4. - 5 pinsc/pscale]
       ((vtarget - vx) / (vtarget - vpk))];
   If[(vin > 1.9*vmin) && (dsin < 2 minperiod), dsin = 2 minperiod];
   tt = Floor[dsin + dsa0]; dsa0 += dsin - tt;
   nxtime = t + tt;
   dsin = ks/kscale (1 - vx/vtarget) * tt*pinsc/pscale;
   dsin = Floor[.5 + dsin*dsscale] / dsscale;
   dsin = dsin - t1^2;
   If[dsin + dsb0 > 0,
      If[dsin + dsb0 > 2 + 3 t1, dsin -= 4 t1 + 4; t1 += 2;];
      If[dsin + dsb0 > t1, dsin -= 2 t1 + 1; t1 += 1];
      ,
      If[(dsin + dsb0 < 2 - 3 t1) && (t1 ≥ 2), dsin += 4 t1 - 4; t1 -= 2;];
      If[(dsin + dsb0 < -t1) && (t1 ≥ 1), dsin += 2 t1 - 1; t1 -= 1];
    ];
   (*t1=Max[0,Floor[.5+Sqrt[dsin+dsb0] ]];dsin-=t1^2;*)

dsb0 += dsin; dsb0 = Max[-128, Min[128, dsb0]];
   offtime = t + t1;
   tthist = {tthist, tt}; t1hist = {t1hist, t1}; t2hist = {t2hist, t1*vx/ (vc1 - vx)};
   }
   ];

(*record state of switch, inductor current, line voltage, pfc output voltage*)
      state = {state, If[sw, 1, 0], i1, vline, vc1};
       , {t, len}];
    state = Transpose[Partition[Flatten[state], 4]];
    tthist = Flatten[tthist]; t1hist = Flatten[t1hist]; t2hist = Flatten[t2hist];
    Print["Min idle time = ", Min[tthist - t1hist - t2hist]];
    If[True,
       ListPlot[Take[Flatten[tthist], 500], PlotRange → All];
       ListPlot[Take[Flatten[t1hist], 500], PlotRange → All];
       ListPlot[Take[Flatten[tthist - t1hist - t2hist], 500], PlotRange → All];
       ListPlot[Take[Flatten[ihist], 500], PlotRange → All];
      ];
    favg = nswitch/len * fs; Print["Average swith rate= ", favg];
    state];
```

Figure 11

```
(* Run simulation, look at waveshapes, spectrums *)
pmax = 100.;
vmin = 90.; fudge = 1.1; fmax = 100000.; vtarget = 400.
L1 = vmin^2 / (pmax * fudge) / fmax / 2 * (1. - Sqrt[2.] vmin / vtarget);
Print["inductor= ", L1];
pout = Table[100., {len}];
C1 = 100. 10^-6;
pin = .9 pout[[1]] / pmax;
out1 = runjlmpfc[120., 60., vtarget, vmin];
linei = out1[[2]] * Sign[out1[[3]]];
seg1 = ({1, 1000} + 3100) * 2;
ListPlot[Take[linei, seg1], PlotJoined -> True, PlotRange -> All];
ListPlot[Take[out1[[3]], seg1], PlotJoined -> True, PlotRange -> All];
seg2 = ({1, 1000} + 7600) * 2;
ListPlot[Take[linei, seg2], PlotJoined -> True, PlotRange -> All];
ListPlot[Take[out1[[3]], seg2], PlotJoined -> True, PlotRange -> All];
widespect[linei, fs]; lowspect[linei, fs, 1000];
ListPlot[Take[out1[[4]], {1, len - 255, 256}], PlotRange -> All, PlotJoined -> True];
```

400.
inductor= 0.000251027
k1= 12.3964 k2= 0.5625
voltage error = 0.00480341   control signal = 4079.4
voltage error = 0.00448558   control signal = 4132.4
voltage error = 0.00350812   control signal = 4125.4
voltage error = 0.00264964   control signal = 4112.4
voltage error = 0.00198135   control signal = 4101.4
voltage error = 0.00147062   control signal = 4092.4
voltage error = 0.00108679   control signal = 4085.4
Min idle time = 2.72909

Figure 12

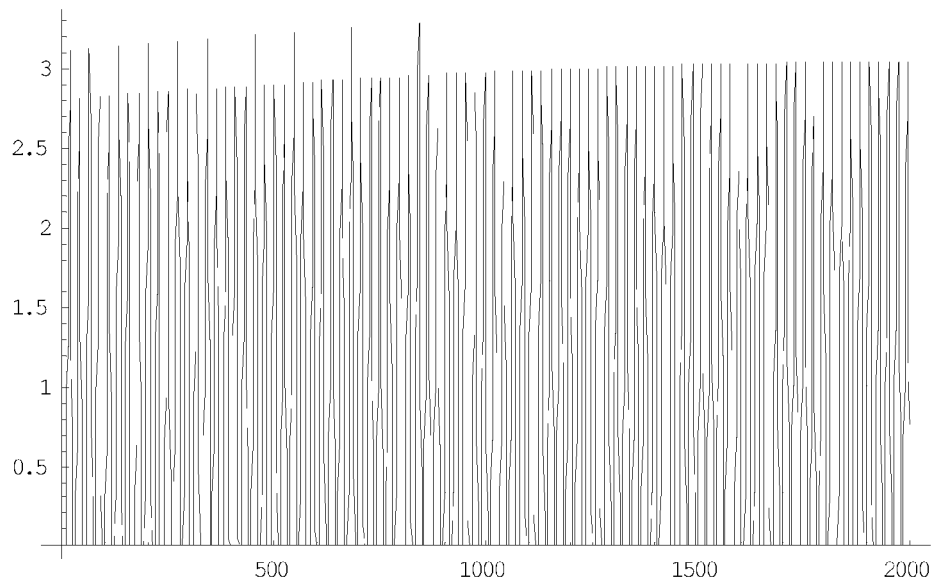
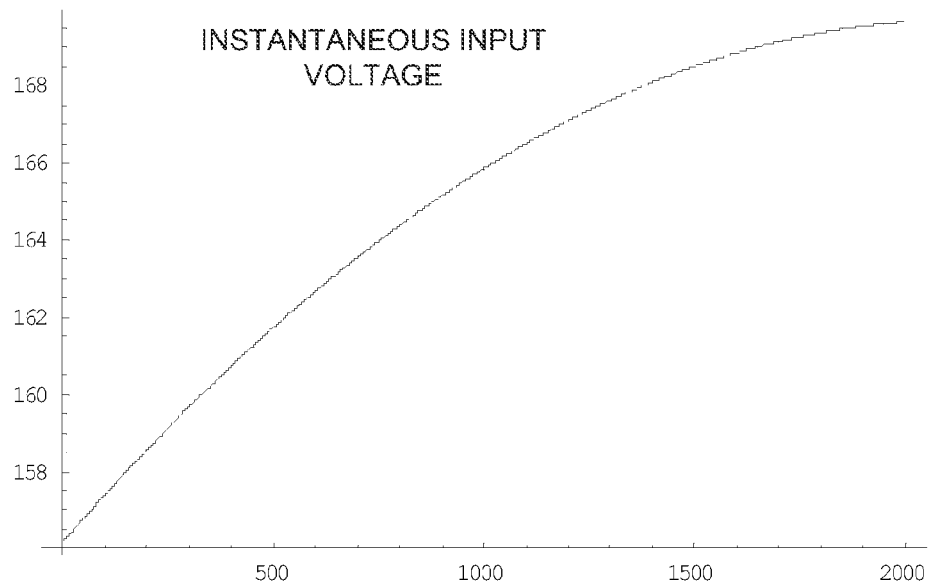
Figure 15

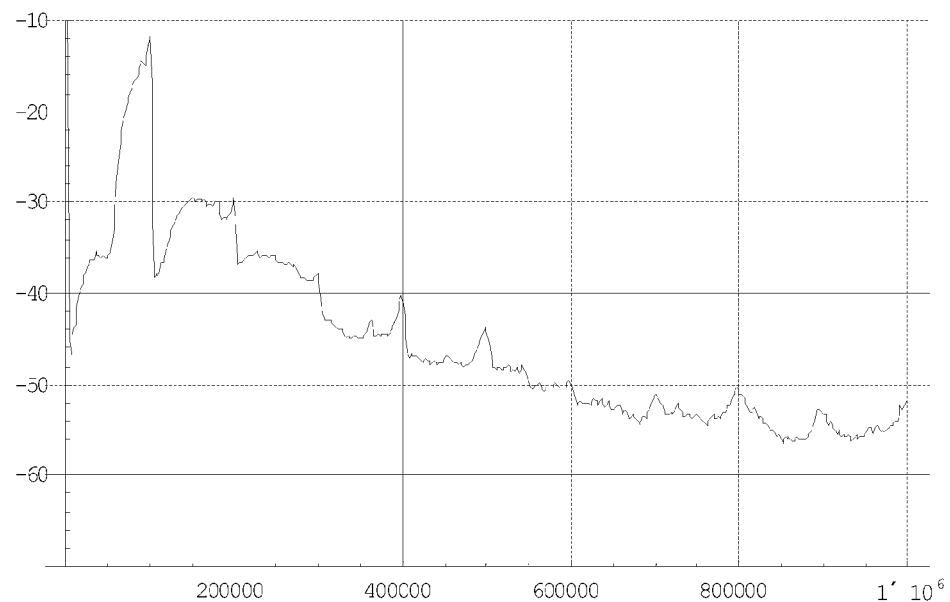
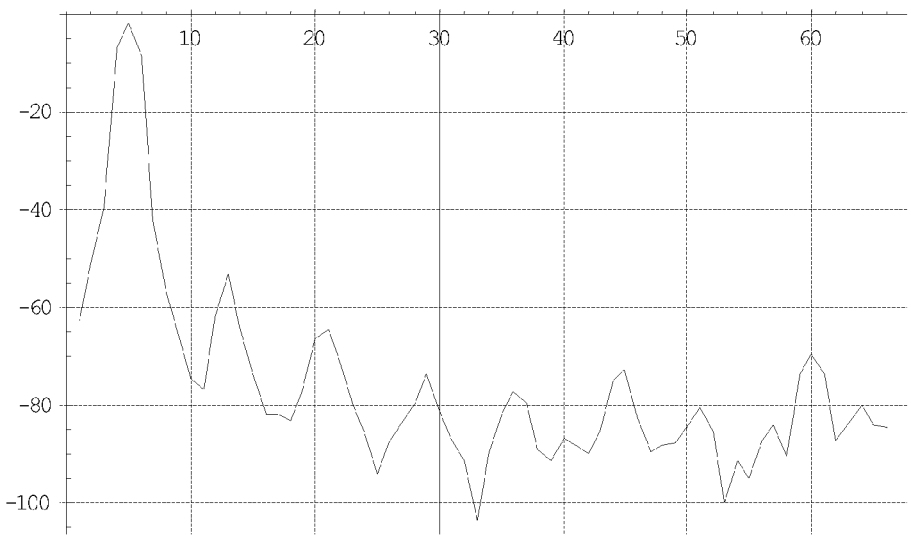
Figure 17

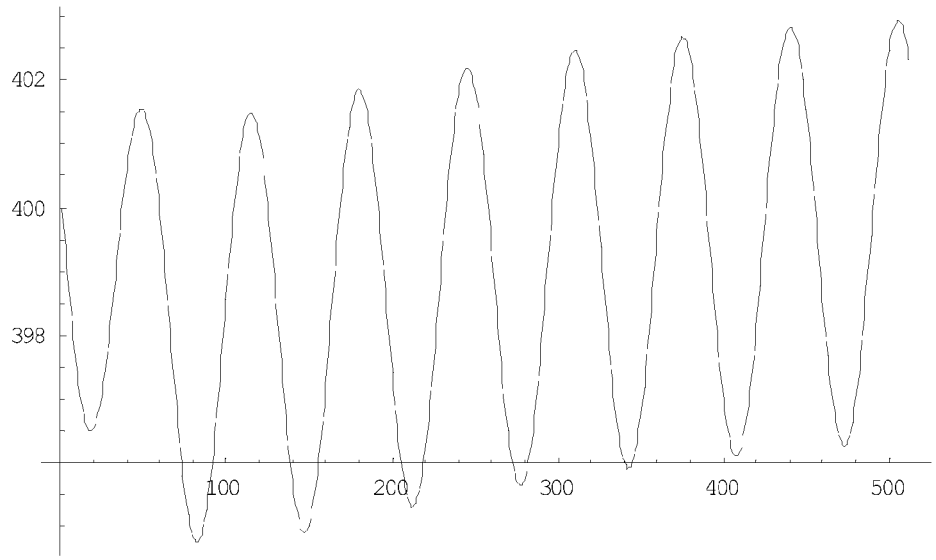

```
(* Run simulation, look at waveshapes, spectrums *)
pmax = 100.;
vmin = 90.; fudge = 1.1; fmax = 100000.; vtarget = 400.
L1 = vmin^2 / (pmax * fudge) / fmax / 2 * (1. - Sqrt[2.] vmin / vtarget);
Print["inductor= ", L1];
pout = Table[50., {len}];
C1 = 100. 10^-6;
pin = pout[[1]] / pmax;
out1 = runjlmpfc[120., 60., vtarget, vmin];
linei = out1[[2]] * Sign[out1[[3]]];
seg1 = ({1, 1000} + 3100) * 2;
ListPlot[Take[linei, seg1], PlotJoined → True, PlotRange → All];
ListPlot[Take[out1[[3]], seg1], PlotJoined → True, PlotRange → All];
seg2 = ({1, 1000} + 7600) * 2;
ListPlot[Take[linei, seg2], PlotJoined → True, PlotRange → All];
ListPlot[Take[out1[[3]], seg2], PlotJoined → True, PlotRange → All];
widespect[linei, fs]; lowspect[linei, fs, 1000];
ListPlot[Take[out1[[4]], {1, len - 255, 256}], PlotRange → All, PlotJoined → True];
```

Figure 18

400.
inductor= 0.000251027
k1= 12.3964  k2= 0.5625
voltage error = -0.000250669   control signal = 2027.
voltage error = -0.000222651   control signal = 2025.
voltage error = -0.000173915   control signal = 2025.
voltage error = -0.000128079   control signal = 2026.
voltage error = -0.0000912194  control signal = 2027.
voltage error = -0.0000695182  control signal = 2027.
voltage error = -0.0000447234  control signal = 2028.
Min idle time = 15.9876

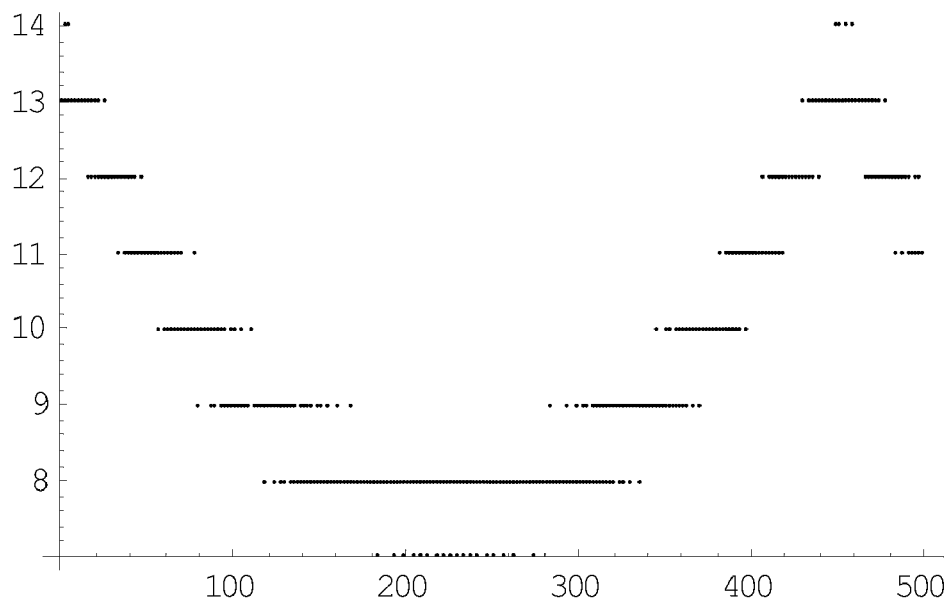
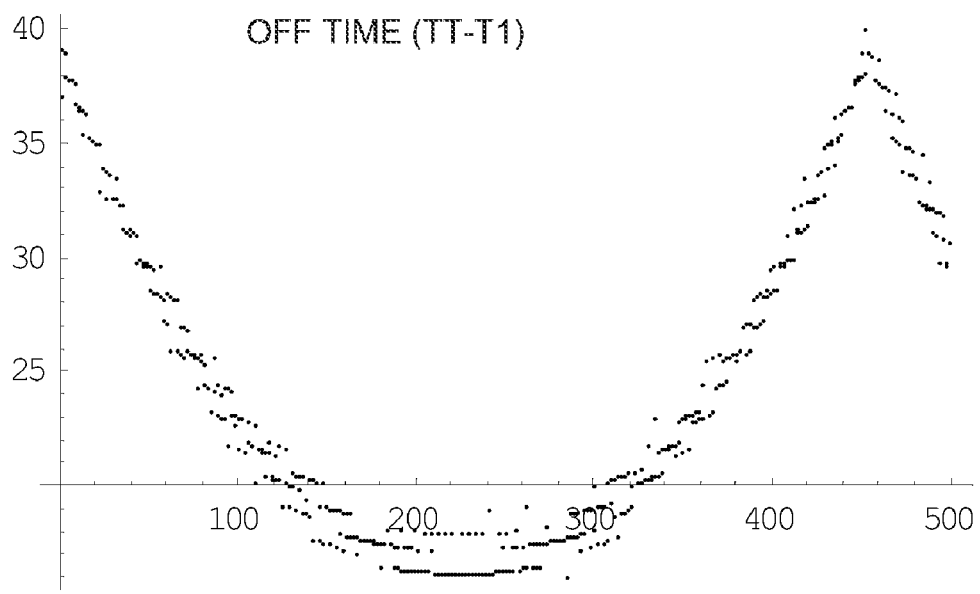
Figure 20

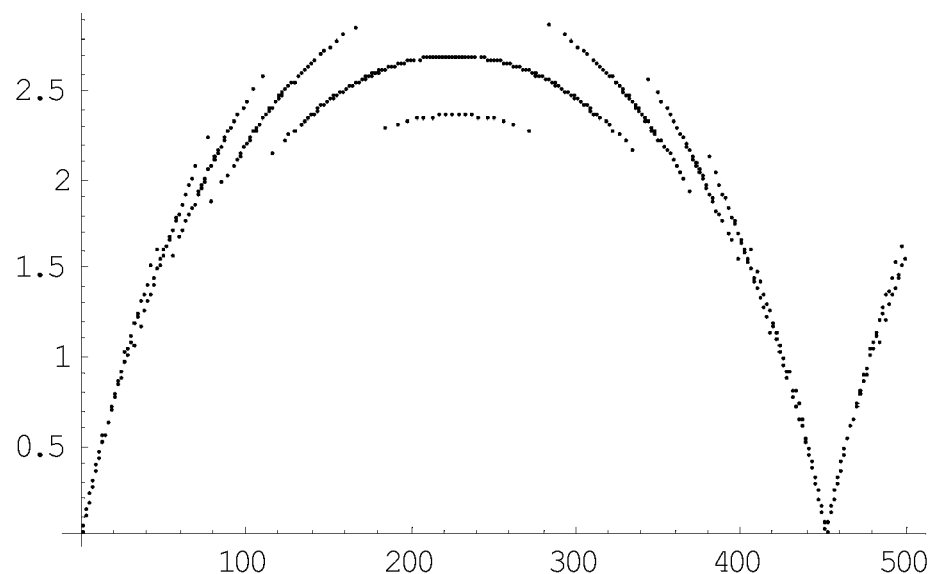
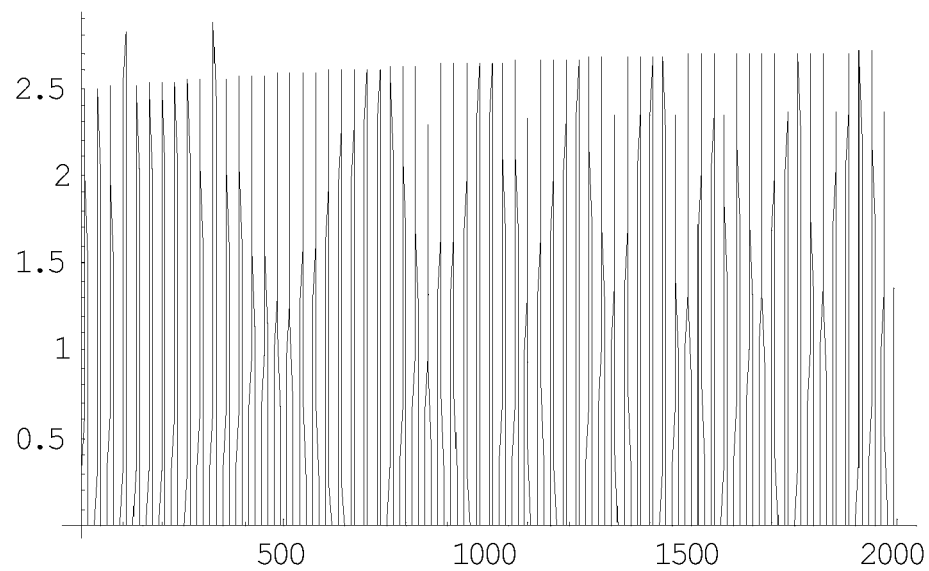
Figure 21

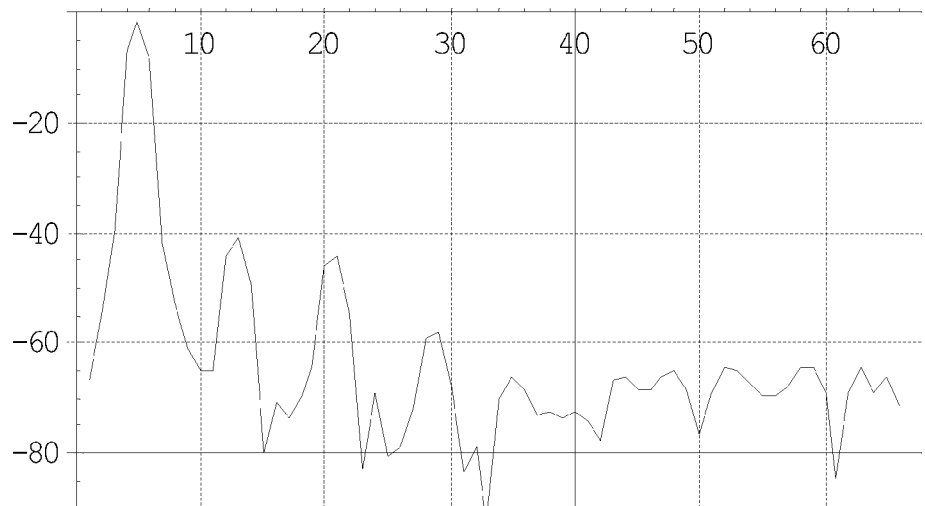
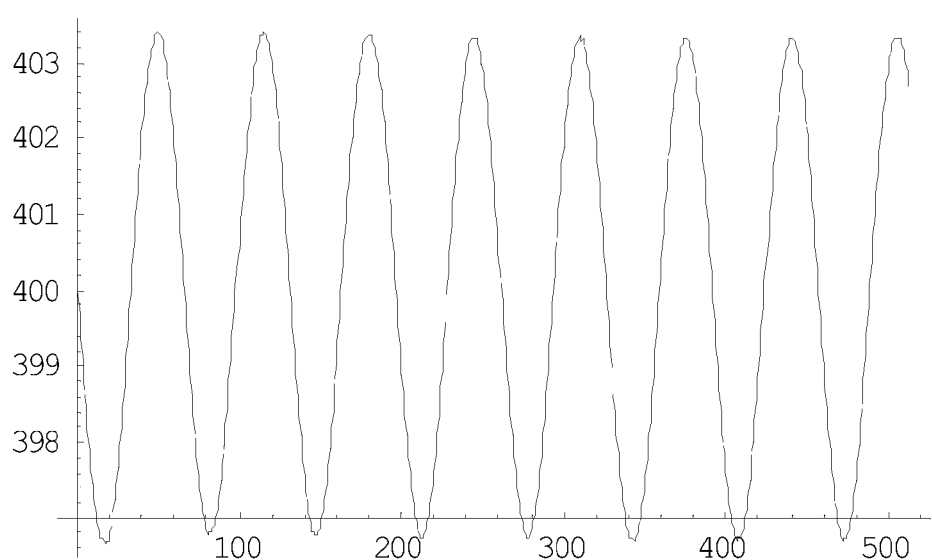
Figure 24

```
pmax = 100.;
vmin = 90.; fudge = 1.1; fmax = 100000.; vtarget = 400.
L1 = vmin^2 / (pmax * fudge) / fmax / 2 * (1. - Sqrt[2.] vmin / vtarget);
Print["inductor= ", L1];
pout = Table[100., {len}];
C1 = 100. 10^-6;
pin = pout[[1]] / pmax;
out1 = runjlmpfc[240., 60., vtarget, vmin];
linei = out1[[2]] * Sign[out1[[3]]];
seg1 = ({1, 1000} + 3100) * 2;
ListPlot[Take[linei, seg1], PlotJoined -> True, PlotRange -> All];
ListPlot[Take[out1[[3]], seg1], PlotJoined -> True, PlotRange -> All];
seg2 = ({1, 1000} + 7600) * 2;
ListPlot[Take[linei, seg2], PlotJoined -> True, PlotRange -> All];
ListPlot[Take[out1[[3]], seg2], PlotJoined -> True, PlotRange -> All];
widespect[linei, fs]; lowspect[linei, fs, 1000];
ListPlot[Take[out1[[4]], {1, len - 255, 256}], PlotRange -> All, PlotJoined -> True];
```

Figure 25

400.
inductor= 0.000251027
k1= 12.3964  k2= 0.140625
voltage error = -0.00027819    control signal = 4073.
voltage error = -0.000214835   control signal = 4074.
voltage error = -0.000163764   control signal = 4075.
voltage error = -0.000156134   control signal = 4073.
voltage error = -0.000102051   control signal = 4075.
voltage error = -0.0000621649  control signal = 4077.
voltage error = -0.0000908581  control signal = 4074.
Min idle time = 13.6132

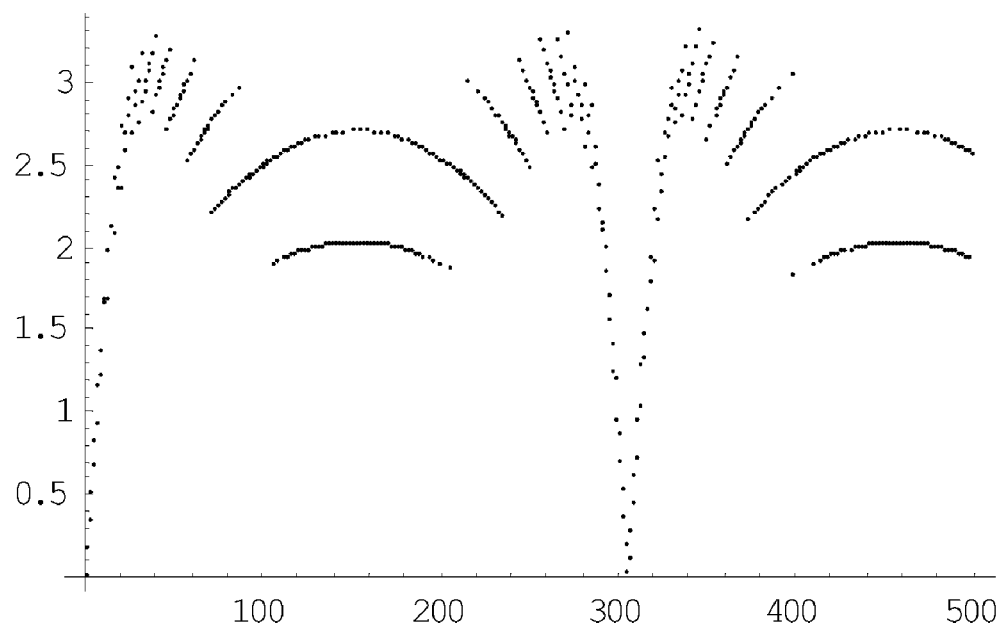
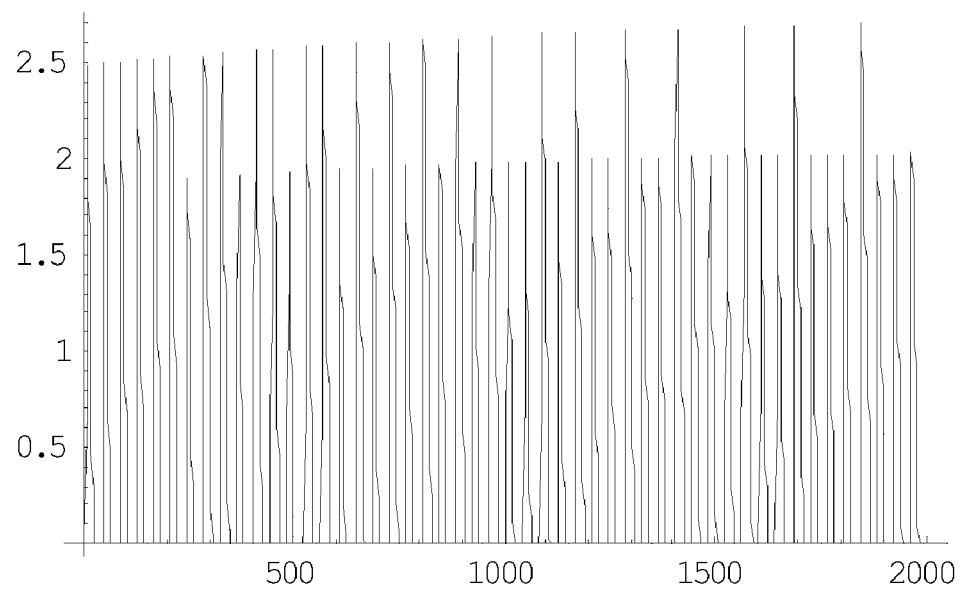
Figure 28

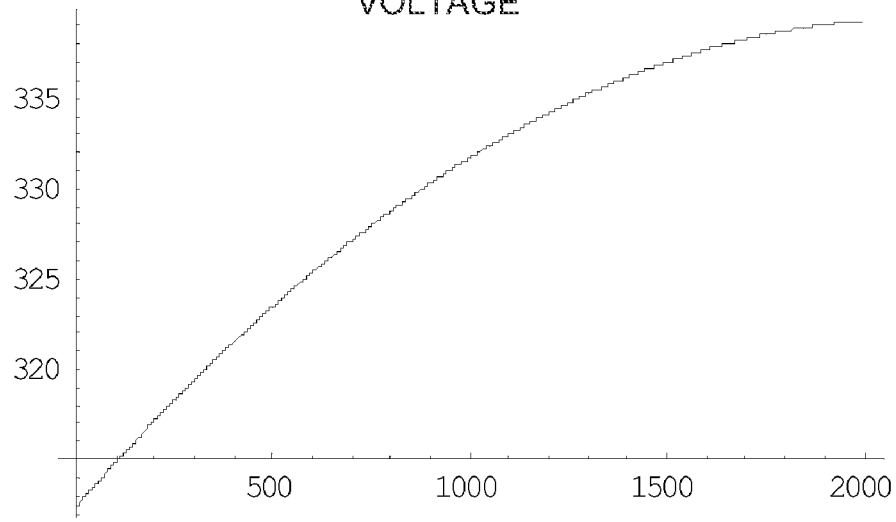
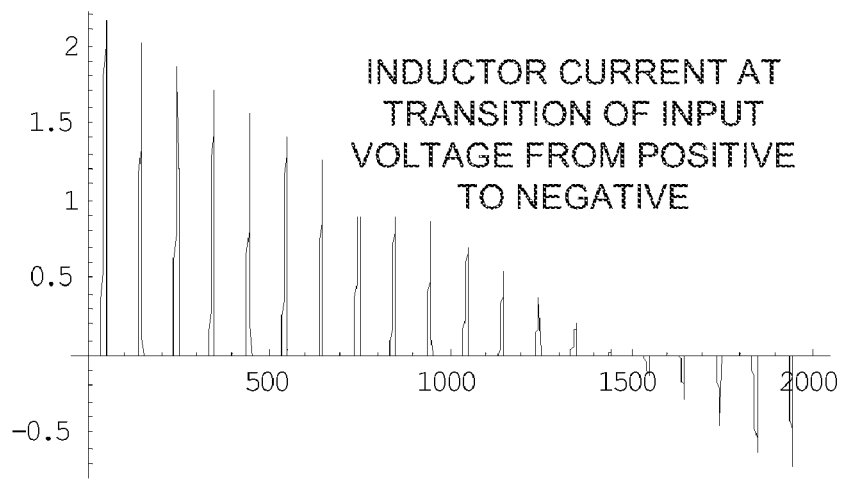
Figure 29

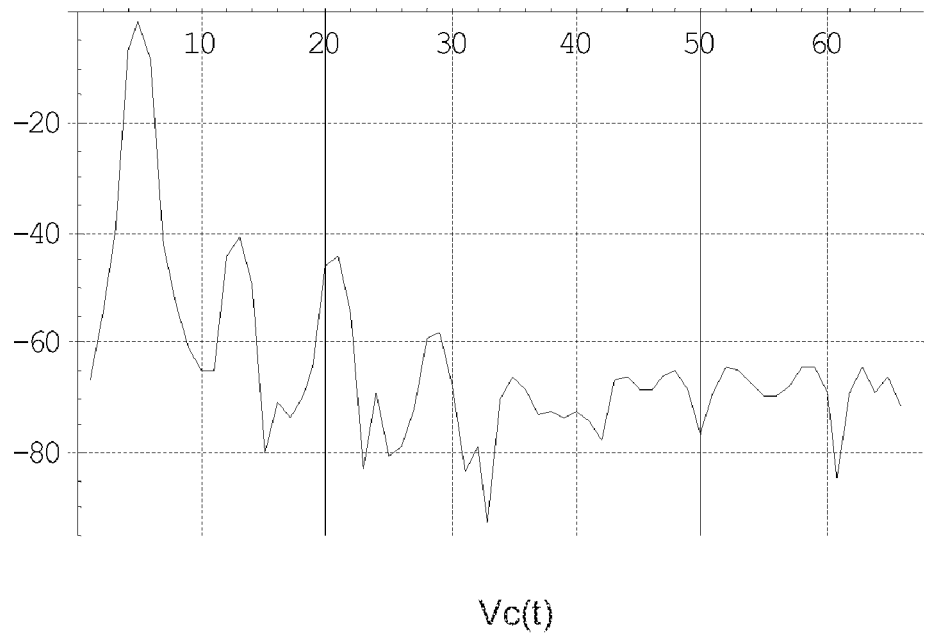
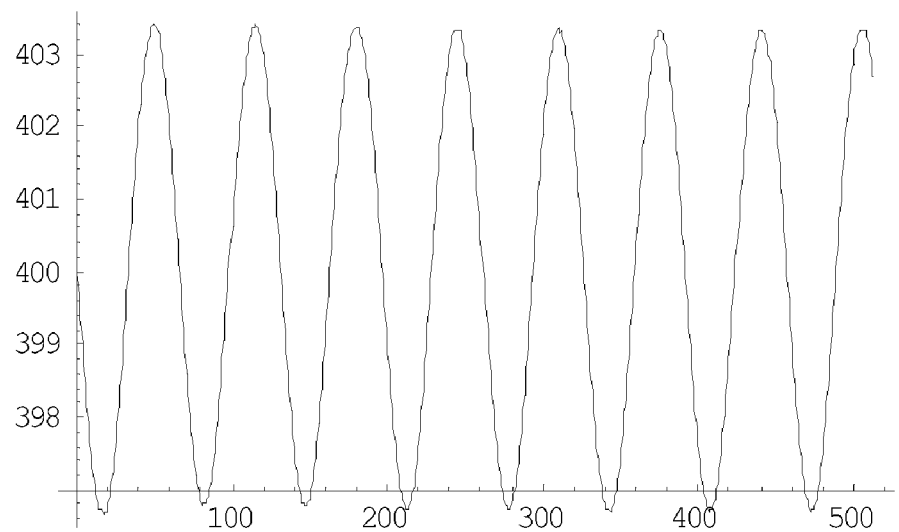
Figure 31

POWER CONTROL SYSTEM USING A NONLINEAR DELTA-SIGMA MODULATOR WITH NONLINEAR POWER CONVERSION PROCESS MODELING

CROSS-REFERENCE TO RELATED APPLICATION

This application claims the benefit under 35 U.S.C. §119 (e) and 37 C.F.R. §1.78 of U.S. Provisional Application No. 60/915,547, filed May 2, 2007, and entitled "Power Factor Correction (PFC) Controller Apparatuses and Methods," and is incorporated by reference in its entirety.

BACKGROUND OF THE INVENTION

1. Field of the Invention

The present invention relates in general to the field of signal processing, and, more specifically, to a power control system that includes a nonlinear delta-sigma modulator with nonlinear power conversion process modeling.

2. Description of the Related Art

Many electronic systems utilize nonlinear processes to generate output signals. For example, plant systems, such as servo control systems and power conversion systems, often utilize nonlinear processes. Power control systems often utilize a switching power converter to convert alternating current (AC) voltages to direct current (DC) voltages or DC-to-DC. Switching power converters often includes a nonlinear energy transfer process to provide power factor corrected energy to a load. Power control systems provide power factor corrected and regulated output voltages to many devices that utilize a regulated output voltage.

FIG. 1 represents a power control system 100, which includes a switching power converter 102. Voltage source 101 supplies an alternating current (AC) input voltage $V_{in}(t)$ to a full, diode bridge rectifier 103. The voltage source 101 is, for example, a public utility, and the AC voltage $V_{in}(t)$ is, for example, a 60 Hz/110 V line voltage in the United States of America or a 50 Hz/220 V line voltage in Europe. The rectifier 103 rectifies the input voltage $V_{in}(t)$ and supplies a rectified, time-varying, line input voltage $V_x(t)$ to the switching power converter.

The switching power converter 102 includes power factor correction (PFC) stage 124 and driver stage 126. The PFC stage 124 is controlled by switch 108 and provides power factor correction. The driver stage 126 is also controlled by switch 108 and regulates the transfer of energy from the line input voltage $V_x(t)$ through inductor 110 to capacitor 106. The inductor current $i_L$ ramps 'up' when the switch 108 conducts, i.e. is "ON". The inductor current $i_L$ ramps down when switch 108 is nonconductive, i.e. is "OFF", and supplies current $i_L$ to recharge capacitor 106. The time period during which inductor current $i_L$ ramps down is commonly referred to as the "inductor flyback time". Diode 111 prevents reverse current flow into inductor 110. In at least one embodiment, the switching power converter 102 operates in discontinuous current mode, i.e. the inductor current $i_L$ ramp up time plus the inductor flyback time is less than the period of switch 108.

Input current $i_L$ is proportionate to the 'on-time' of switch 108, and the energy transferred to inductor 110 is proportionate to the 'on-time' squared. Thus, the energy transfer process is one embodiment of a nonlinear process. In at least one embodiment, control signal $CS_0$ is a pulse width modulated signal, and the switch 108 is an n-channel field effect transistor that conducts when the pulse width of $CS_0$ is high. Thus, the 'on-time' of switch 108 is determined by the pulse width of control signal $CS_0$. Accordingly, the energy transferred to inductor 110 is proportionate to a square of the pulse width of control signal $CS_0$.

Capacitor 106 supplies stored energy to load 112. The capacitor 106 is sufficiently large so as to maintain a substantially constant output voltage $V_x(t)$, as established by a power factor correction (PFC) and output voltage controller 114 (as discussed in more detail below). The output voltage $V_x(t)$ remains substantially constant during constant load conditions. However, as load conditions change, the output voltage $V_x(t)$ changes. The PFC and output voltage controller 114 responds to the changes in $V_x(t)$ and adjusts the control signal $CS_0$ to resume a substantially constant output voltage as quickly as possible. The output voltage controller 114 includes a small capacitor 115 to filter any high frequency signals from the line input voltage $V_x(t)$.

The power control system 100 also includes a PFC and output voltage controller 114. PFC and output voltage controller 114 controls switch 108 and, thus, controls power factor correction and regulates output power of the switching power converter 102. The goal of power factor correction technology is to make the switching power converter 102 appear resistive to the voltage source 101. Thus, the PFC and output voltage controller 114 attempts to control the inductor current $i_L$ so that the average inductor current $i_L$ is linearly and directly related to the line input voltage $V_x(t)$. Prodić, *Compensator Design and Stability Assessment for Fast Voltage Loops of Power Factor Correction Rectifiers*, IEEE Transactions on Power Electronics, Vol. 22, No. 5, September 2007, pp. 1719-1729 (referred to herein as "Prodić"), describes an example of PFC and output voltage controller 114. The PFC and output voltage controller 114 supplies a pulse width modulated (PWM) control signal $CS_0$ to control the conductivity of switch 108. In at least one embodiment, switch 108 is a field effect transistor (FET), and control signal $CS_0$ is the gate voltage of switch 108. The values of the pulse width and duty cycle of control signal $CS_0$ depend on two feedback signals, namely, the line input voltage $V_x(t)$ and the capacitor voltage/output voltage $V_c(t)$.

PFC and output controller 114 receives two feedback signals, the line input voltage $V_x(t)$ and the output voltage $V_c(t)$, via a wide bandwidth current loop 116 and a slower voltage loop 118. The line input voltage $V_x(t)$ is sensed from node 120 between the diode rectifier 103 and inductor 110. The output voltage $V_c(t)$ is sensed from node 122 between diode 111 and load 112. The current loop 116 operates at a frequency $f_c$ that is sufficient to allow the PFC and output controller 114 to respond to changes in the line input voltage $V_x(t)$ and cause the inductor current $i_L$ to track the line input voltage to provide power factor correction. The current loop frequency is generally set to a value between 20 kHz and 100 kHz. The voltage loop 118 operates at a much slower frequency $f_v$, typically 10-20 Hz. By operating at 10-20 Hz, the voltage loop 118 functions as a low pass filter to filter an alternating current (AC) ripple component of the output voltage $V_c(t)$.

The PFC and output voltage controller 114 controls the pulse width (PW) and period (TT) of control signal $CS_0$. Thus, PFC and output voltage controller 114 controls the nonlinear process of switching power converter 102 so that a desired amount of energy is transferred to capacitor 106. The desired amount of energy depends upon the voltage and current requirements of load 112. To regulate the amount of energy transferred and maintain a power factor correction close to one, PFC and output voltage controller 114 varies the period of control signal $CS_0$ so that the input current $i_L$ tracks the changes in input voltage $V_x(t)$ and holds the output voltage $V_c(t)$ constant. Thus, as the input voltage $V_x(t)$ increases, PFC and output voltage controller 114 increases the period T of control signal $CS_0$, and as the input voltage $V_x(t)$ decreases, PFC and output voltage controller 114 decreases the period of control signal $CS_0$. At the same time, the pulse width PW of control signal $CS_0$ is adjusted to maintain a constant duty cycle (D) of controls signal $CS_0$, and, thus, hold the output voltage $V_C(t)$ constant. In at least one embodiment, the PFC and output voltage controller 114 updates the control signal $CS_0$ at a frequency much greater than the frequency of input voltage $V_x(t)$. The frequency of input voltage $V_x(t)$ is generally 50-60 Hz. The frequency 1/TT of control signal $CS_0$ is, for example, between 25 kHz and 100 kHz. Frequencies at or above 25 kHz avoid audio frequencies and frequencies at or below 100 kHz avoids significant switching inefficiencies while still maintaining good power factor correction, e.g. between 0.9 and 1, and an approximately constant output voltage $V_C(t)$.

FIG. 2 depicts a generalized representation of a power control system 200 described in Prodić. The PFC and output voltage controller 202 of Prodić includes an error generator 204 to determine an error signal $e_d(t)$. The error signal $e_d(t)$ represents a difference between the output voltage $V_x(t)$ and a reference voltage $V_{REF}$. The reference voltage $V_{REF}$ is set to the desired value of output voltage $V_c(t)$. A comb filter 206 filters the error signal $e_d(t)$. The comb filter 206 has significant attenuation at equally spaced frequencies (referred to as "notches") and has unity gain at other frequencies. The comb filter 206 automatically tunes the notches to match twice the line frequency $f_L$ and harmonics of the line frequency. The line frequency $f_L$ is the frequency of input voltage $V_{in}(t)$. According to Prodić, the comb filter 206 generates a "ripple free" error signal $e_{vf}(t)$. Compensator 208 processes the filtered error signal, and input voltage feedback signal $V_x(t)$ generates a compensator output signal. The pulse width modulator (PWM) 210 processes the compensator output signal to generate control signal $CS_0$.

SUMMARY OF THE INVENTION

In one embodiment of the present invention, a power factor correction controller includes a processor to receive and process one or more switching power converter feedback signals and generate a pulse width control signal using each processed feedback signal. The power factor correction controller also includes a pulse width modulator, coupled to the signal processor, having an input to receive the pulse width control signal and generate a pulse width modulated, power factor correction (PFC) control signal to control a switch that controls a power factor correction stage of the switching power converter. A pulse width of the PFC control signal varies approximately with a square root of the PWM control signal.

In another embodiment of the present invention, a method of controlling power factor correction of a switching power converter includes receiving one or more switching power converter feedback signals and processing each received feedback signal. The method further includes generating a pulse width control signal using each processed feedback signal and generating a pulse width modulated, power factor correction (PFC) control signal to control a switch that controls a power factor correction stage of the switching power converter. A pulse width of the PFC control signal varies approximately with a square root of the PWM control signal.

In a further embodiment of the present invention, an apparatus to control power factor correction of a switching power converter includes means for receiving one or more switching power converter feedback signals. The apparatus also includes means for generating a pulse width control signal using each processed feedback signal and means for generating a pulse width modulated, power factor correction (PFC) control signal to control a switch that controls a power factor correction stage of the switching power converter. A pulse width of the PFC control signal varies approximately with a square root of the PWM control signal.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIGS. 9-31 depict a program that emulates the power control system of FIG. 8 and includes graphs depicting emulation results.

DETAILED DESCRIPTION

A power control system includes a switching power converter and a power factor correction (PFC) and output voltage controller. The switching power converter utilizes a nonlinear energy transfer process to provide power to a load. The PFC and output voltage controller generates a control signal to control power factor correction and voltage regulation of the switching power converter. The PFC and output voltage controller includes a nonlinear delta-sigma modulator that models the nonlinear energy transfer process of the switching power converter. The nonlinear delta-sigma modulator generates an output signal used to determine the control signal. By using the nonlinear delta-sigma modulator in a control signal generation process, the PFC and output voltage controller generates a spectrally noise shaped control signal. In at least one embodiment, noise shaping of the control signal improves power factor correction and output voltage regulation relative to conventional systems.

In at least one embodiment, the PFC and output voltage controller control signal is a pulse width modulated signal. The period of the pulse width modulated control signal controls output voltage regulation, and the duty cycle of the control signal controls power factor correction. In at least one embodiment, the period of the control signal is increased for lower power demands of the switching power converter and lower input voltages. The period of the control signal can also be modulated in accordance with any number of modulation strategies. For example, in at least one embodiment, the PFC and output voltage controller modulates the period of the control signal in accordance with a spread spectrum strategy to reduce electromagnetic interference of the power control system.

Figure 1:
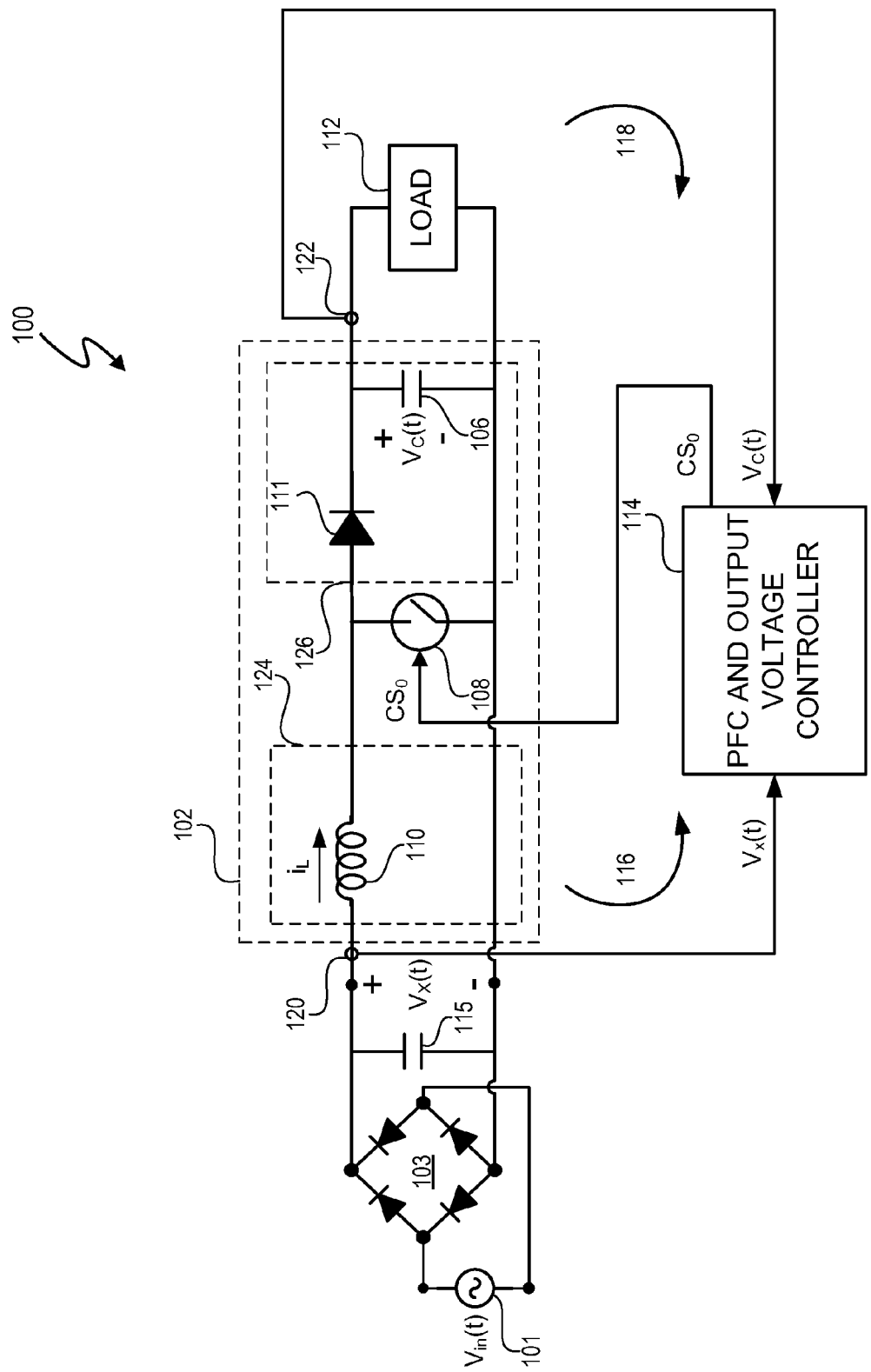
FIG. 1 (labeled prior art) depicts a power control system
Figure 2:
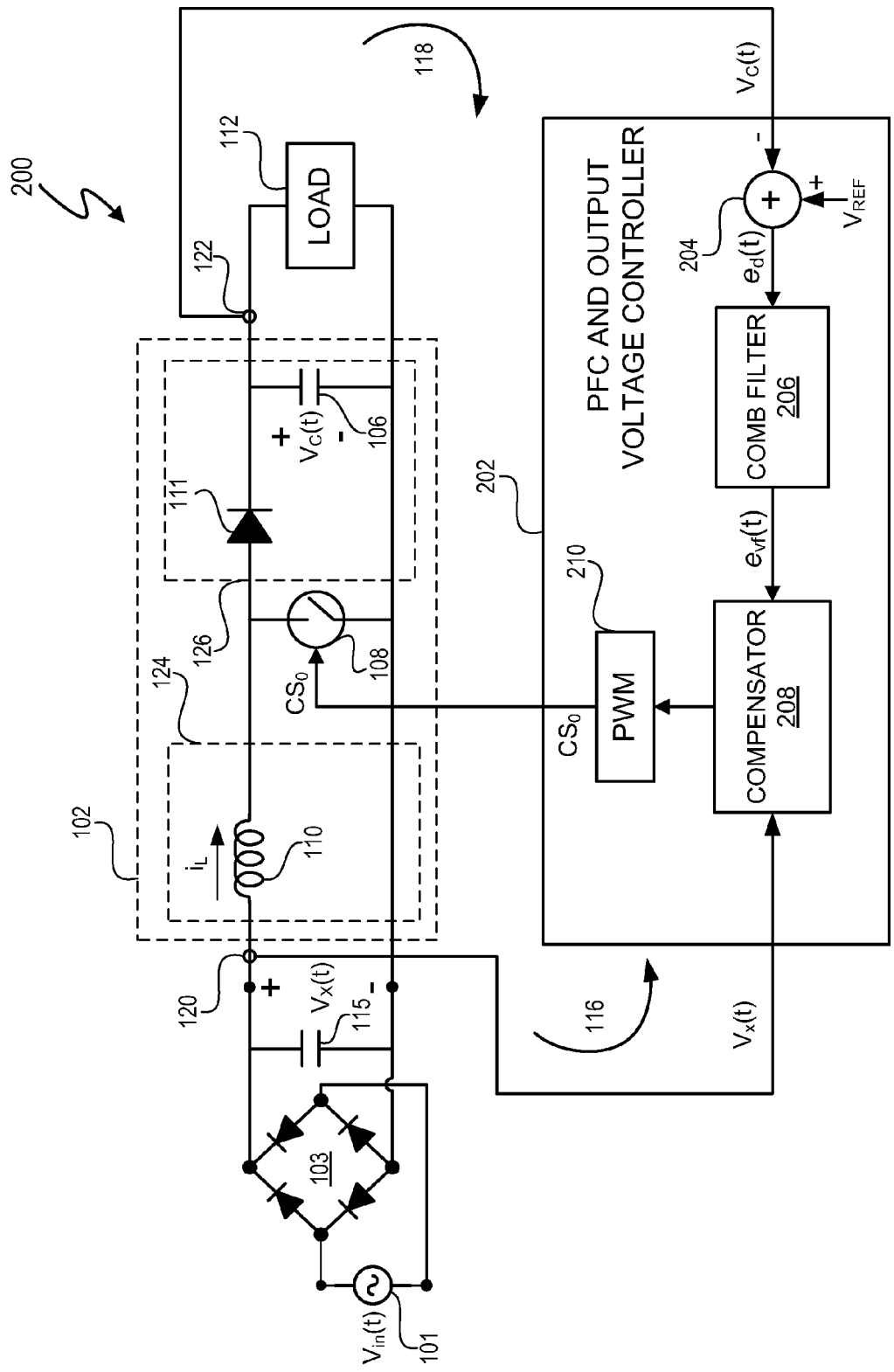
FIG. 2 (labeled prior art) depicts another embodiment of a power control system.
Figure 3:
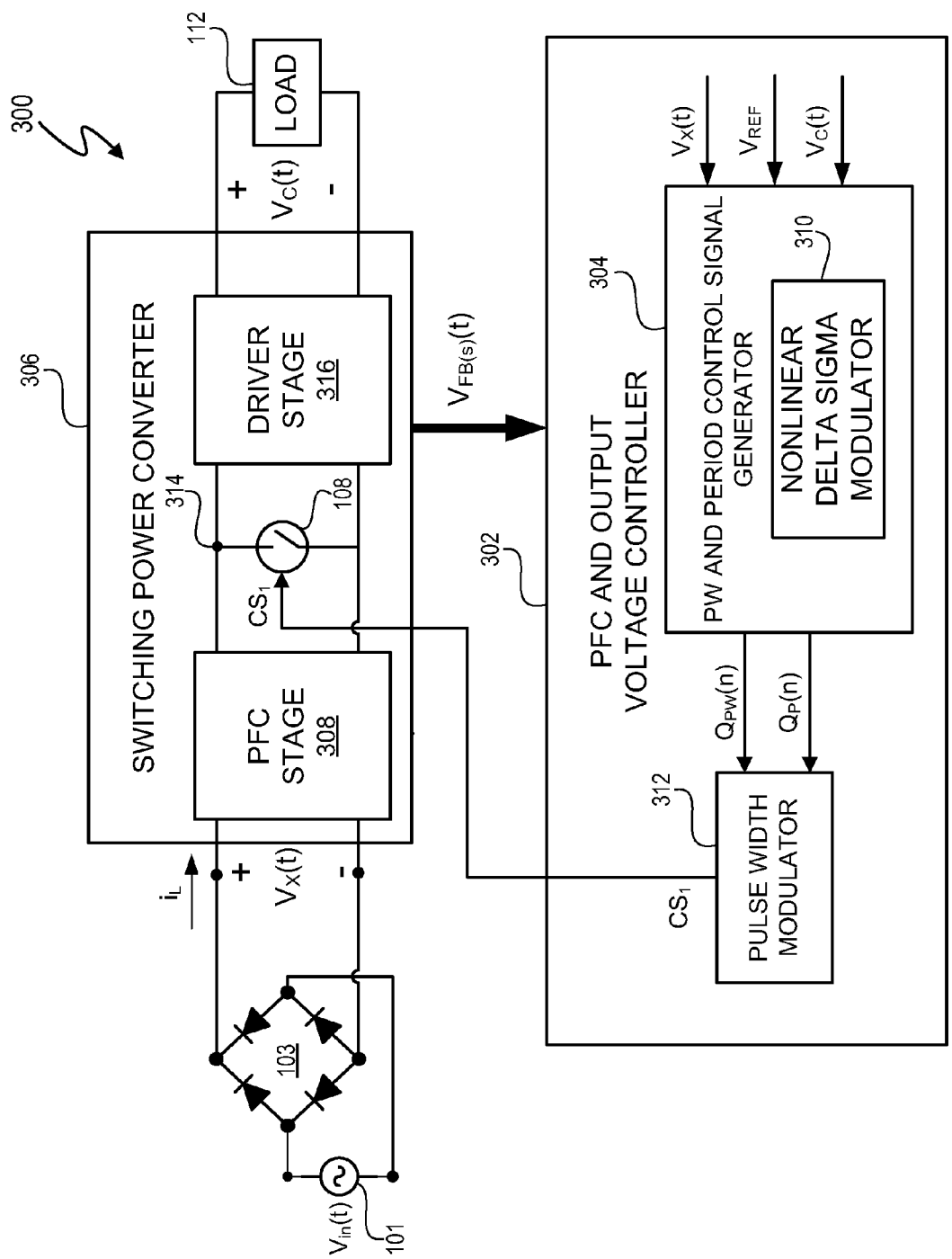
FIG. 3 depicts a power control system with a nonlinear delta-sigma modulator.

FIG. 3 depicts power control system 300, and power control system 300 includes a PFC and output voltage controller 302. The PFC and output voltage controller 302 includes a pulse width (PW) and period control signal generator 304 to generate a pulse width control signal $Q_{PW}(n)$ and a period control signal $Q_P(n)$. The PW and period signal generator 304 includes a nonlinear delta-sigma modulator 310. The nonlinear delta-sigma modulator 310 models a nonlinear energy transfer process of switching power converter 306. Switching power converter 306 includes a PFC stage 308 to provide power factor correction in accordance with control signal $CS_1$.

The control signal $CS_1$ controls power factor correction by causing the inductor current $i_L$ to directly and linearly track changes in the line input voltage $V_x(t)$. In at least one embodiment, PFC stage 308 is identical to PFC stage 124. Switching power converter 306 also includes a driver stage 316 to provide an approximately constant voltage and, thus, approximately constant power to load 112 in accordance with control signal $CS_1$. The control signal $CS_1$ controls output voltage regulation by causing the output voltage $V_c(t)$ to track a reference voltage $V_{REF}$. In at least one embodiment, the reference voltage $V_{REF}$ is set to a desired output voltage of switching power converter 306. For example, a light emitting diode fixture may have a 400 V input voltage rating, and reference voltage $V_{REF}$ is set to 400 V. In at least one embodiment, the reference voltage can be manually or automatically modified to account for differing power demands as, for example, load 112 changes. In at least one embodiment, driver stage 316 is identical to driver stage 126. Unless explicitly indicated otherwise, the term "approximately" represents a nearly exact or an exact match. A value is "nearly exact" if the value achieves acceptable performance.

Power control system 300 also includes a pulse width modulator 312 to generate the pulse width modulated control signal $CS_1$. Pulse width modulator 312 modifies the pulse width and period of control signal $CS_1$ in accordance with the pulse width control signal $Q_{PW}(n)$ and modifies the period of control signal $CS_1$ in accordance with period input signal $Q_P(n)$. In at least one embodiment, pulse width control signal $Q_{PW}(n)$ and period control signal $Q_P(n)$ are discrete, quantization output signals of respective delta-sigma modulators. Pulse width modulator 312 provides the control signal to switch 108, and control signal $CS_1$ controls the conductive state of switch 108. In at least one embodiment, switch 108 is a field effect transistor (FET), such as an n-channel, and control signal $CS_1$ is the gate voltage of switch 108.

The PFC and output voltage controller 302 utilizes the line input voltage $V_x(t)$ and the output voltage $V_c(t)$ of switching power converter 306 to determine control signal $CS_1$. In at least one embodiment, feedback signal(s) $V_{FB(s)}(t)$ represents line input voltage $V_x(t)$, output voltage $V_c(t)$, a switch node voltage at switch node 314, or any combination thereof. In at least one embodiment, feedback signal $V_{FB(s)}(t)$ is a single feedback signal representing the voltage at the switch node 314. In this embodiment, the PFC and output voltage controller 302 can determine both the line input voltage $V_x(t)$ and the output voltage $V_c(t)$ from the single feedback signal $V_{FB(s)}(t)$ as, for example, described in U.S. patent application entitled "Power Factor Correction Controller With Feedback Reduction", inventor John L. Melanson, assignee Cirrus Logic, Inc., and Ser. No. 11/967,271 ("Melanson I") and U.S. patent application entitled "Power Factor Correction Controller With Switch Node Feedback", inventor John L. Melanson, assignee Cirrus Logic, Inc., and Ser. No. 11/967,272 ("Melanson II"). Melanson I and Melanson II are incorporated herein by reference in their entireties.

In at least one embodiment, each signal represented by feedback signal(s) $V_{FB(s)}(t)$ is scaled to a value that is useable by PFC and output voltage controller 302 without damaging PFC and output voltage controller 302. For example, in at least one embodiment, PFC and output voltage controller 302 is implemented entirely as an integrated circuit or in combination with digital and/or analog components. The integrated circuit has a maximum input signal voltage. Accordingly, each feedback signal(s) $V_{FB(s)}(t)$ is scaled as, for example, described in Melanson I and Melanson II.

As subsequently described in more detail, in at least one embodiment, the nonlinear delta-sigma modulator 310 processes an input signal, models the nonlinear energy transfer process of switching power converter 306, and provides a noise shaped output signal. In at least one embodiment, the nonlinear process of switching power converter 306 is identical to the nonlinear energy transfer process of switching converter 102. By modeling the nonlinear energy transfer process, in at least one embodiment, the nonlinear delta-sigma modulator 310 can be used to provide spectral noise shaping of the control signal $CS_1$. The presence of noise in control signal $CS_1$ within a baseband frequency of control signal $CS_1$ allows the noise to influence the power factor correction and output voltage regulation of switching power converter 306. By removing the influence of noise from a baseband of control signal $CS_1$, the control signal $CS_1$ exercises improved control over switching power converter 306.

Figure 4:
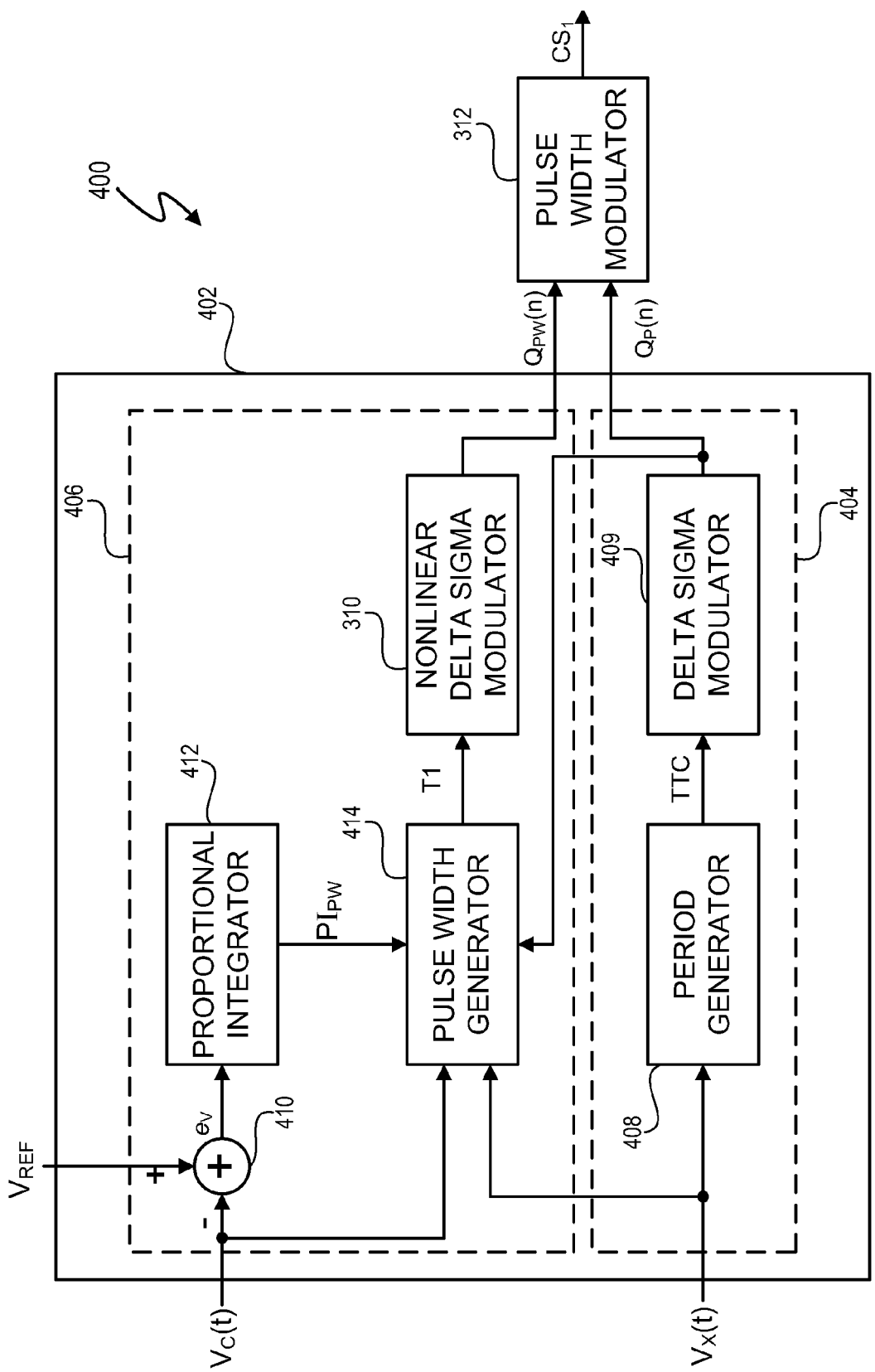
FIG. 4 depicts a PFC and output voltage controller with a nonlinear delta-sigma modulator.

FIG. 4 depicts PFC and output voltage controller 400, which represents one embodiment of PFC and output voltage controller 302, and depicts PW and period control signal generator 402, which represents one embodiment of PW and period signal generator 304. The PW and period signal generator 304 includes systems 404 and 406 to determine control signal $CS_1$. The period control system 404 determines the period of control signal $CS_1$, and the pulse width control system 406 determines the pulse width of the control signal $CS_1$. In at least one embodiment, the PFC and output voltage controller 400 updates control signal $CS_1$ at a frequency between 25 kHz and 100 Mhz. Updating above 25 kHz avoids audible switching noises, and updating below 100 MHz results in a more efficient operation of switch 108.

The period control system 404 includes a period generator 408 to generate a period control signal TTC. The period control signal TTC controls the period of control signal $CS_1$. In at least one embodiment, the period generator 408 receives line input voltage $V_x(t)$, and period generator 408 generates period control signal TTC in response to line input voltage $V_x(t)$. In at least one embodiment, the line input voltage is sampled to generate a discrete value for use by period generator 408. In at least one embodiment, the period generator 408 generates a longer period of control signal $CS_0$ for lower power requirements of load 112 and as rectified, line input voltage $V_x(t)$ decreases. In at least one embodiment, the period generator 408 determines the period of control signal $CS_1$ in accordance with a spread spectrum strategy. The spread spectrum strategy adjusts the period of control signal $CS_1$, and, thus, the frequency of control signal $CS_1$, using a strategy that reduces electro-magnetic interference generated by, for example, switching power converter 306.

In at least one embodiment, the period control system 404 also includes a delta-sigma modulator 409. The delta-sigma modulator 409 receives the period control signal TTC and generates a period control signal $Q_P(n)$. In this embodiment, the period control signal $Q_P(n)$ is an output of a quantizer (not shown) of delta-sigma modulator 409. The delta-sigma modulator 409 spectrally noise shapes the control signal TTC. Spectral noise shaping reduces the influence of noise on the control signal TTC and, thus, allows PFC and output voltage controller 400 to provide better power factor correction and output voltage regulation control for switching power converter 306. Exemplary conventional delta-sigma modulator design and operation is described in the book *Understanding Delta-Sigma Data Converters* by Schreier and Temes, IEEE Press, 2005, ISBN 0-471-46585-2. In at least one embodiment, the period control system 404 does not include the delta-sigma modulator 409, and the period generator 308 provides the period control signal TTC directly to the pulse width modulator 312.

Pulse width control system 406 determines a pulse width of control signal $CS_1$ so that control signal $CS_1$ tracks the line input voltage $V_x(t)$ and minimizes any difference between the output voltage $V_c(t)$ and the reference voltage $V_{REF}$. An error generator 410 determines an error signal $e_v$ between the reference voltage $V_{REF}$ and the output voltage $V_c(t)$ by subtracting the output voltage $V_c(t)$ from the reference voltage $V_{REF}$. A proportional integrator 412 processes the error signal $e_v$ to generate proportional-integral (PI) signal $PI_{PW}$. The proportional integrator 412 adjusts the rate of response of PFC and output voltage controller 400 to changes in the output voltage $V_c(t)$. The PI signal $PI_{PW}$ reflects the rate adjustment. If the response is too slow, then the output voltage $V_c(t)$ may fail to track changes in power demand of load 112 and, thus, fail to maintain an approximately constant value. If the response is too fast, then the output voltage $V_c(t)$ may react to minor, brief fluctuations in the power demand of load 112. Such fast reactions could cause oscillations in PFC and output voltage controller 400, damage or reduce the longevity of components, or both. Thus, the particular rate of response by proportional integrator 412 is a design choice. Setting the rate of response is subsequently discussed with reference to FIG. 7.

The pulse width control system also includes a pulse width generator 414 to determine a pulse width control signal T1. The pulse width generator 414 generates the pulse width control signal T1 so that the duty cycle of control signal $CS_1$ tracks the line input voltage $V_x(t)$ and, thus, provides power factor correction. In at least one embodiment, the pulse width $T_1$ of control signal $CS_1$ is determined in accordance with Equation [1]:

$$T1^2 = \frac{2 \cdot L}{V_{rms}^2} \cdot P_{PW} \cdot TT \cdot \left(1 - \frac{V_x}{V_C}\right). \quad [1]$$

"T1" is the pulse width of the control signal $CS_1$ as represented by period control signal $Q_P(n)$. "L" represents an inductor value of PFC stage 308, such as inductor 110. "$V_{rms}$" represents the root mean square of line input voltage $V_{in}(t)$. "$PI_{PW}$" represents PI signal $PI_{PW}$, which is the output of the proportional integrator 412. "TT" is the period of control signal $CS_1$ as generated by period control system 404. In at least one embodiment, TT is the quantizer output signal $Q_P(n)$ of delta-sigma modulator 409. In at least one embodiment, TT is the period control signal TTC generated by period generator 408, if delta-sigma modulator 409 is not included in period control system 404 "$V_X$" is a sampled value of the current value of the line input voltage $V_x(t)$. "$V_C$" is a sampled value of the output voltage $V_c(t)$ used to generate the PI output signal $PI_{PW}$.

In at least one embodiment, the switching power converter 306 operates in discontinuous current mode. When operating in discontinuous current mode, the period generator 408 ensures that the period of control signal $CS_1$ exceeds the ramp-up and ramp-down times of inductor current $i_L$. In at least one embodiment to ensure that switching power converter 306 operates in discontinuous current mode, an inductor L of PFC stage 308, such as inductor 110 is set in accordance with Equation [2]:

$$L = V_{min}^2 \Big/ \left[(P_{max} \cdot J) \cdot (2 \cdot f_{max}) \cdot \left[1 - \sqrt{2}\left(\frac{V_{min}}{V_{cap}}\right)\right]\right]. \quad [2]$$

"L" is the value of the inductor of PFC stage 308. "$V_{min}$" is the root mean square (rms) minimum input voltage $V_{in}(t)$. "$P_{max}$" is the maximum power demand of load 112. "J" is an over-design factor and any value greater than 1 indicates an over-design. In at least one embodiment, "J" is 1.1. "$f_{max}$" is a maximum frequency of control signal $CS_1$. "$V_{cap}$" is a nominal expected output voltage for load 112.

For the inductor L value of Equation [2], in at least one embodiment, the switching power converter will operate in discontinuous current mode if the pulse width control signal satisfies Equation [3]:

$$T1^2 = k1 \cdot k2 \cdot \left(1 - \frac{V_x}{V_C}\right) \cdot TT \cdot k3. \quad [3]$$

$$k1 = TT_{min}/J \cdot \left[1 - \sqrt{2}\left(\frac{V_{min}}{V_{cap}}\right)\right] \quad [4]$$

$$k2 = \left(\frac{V_{min}}{V_{in}(t)}\right) \quad [5]$$

"k3" is a power scale factor between 0 and 1. The remaining variables in Equations [3], [4], and [5] are the same as previously described.

Figure 8:
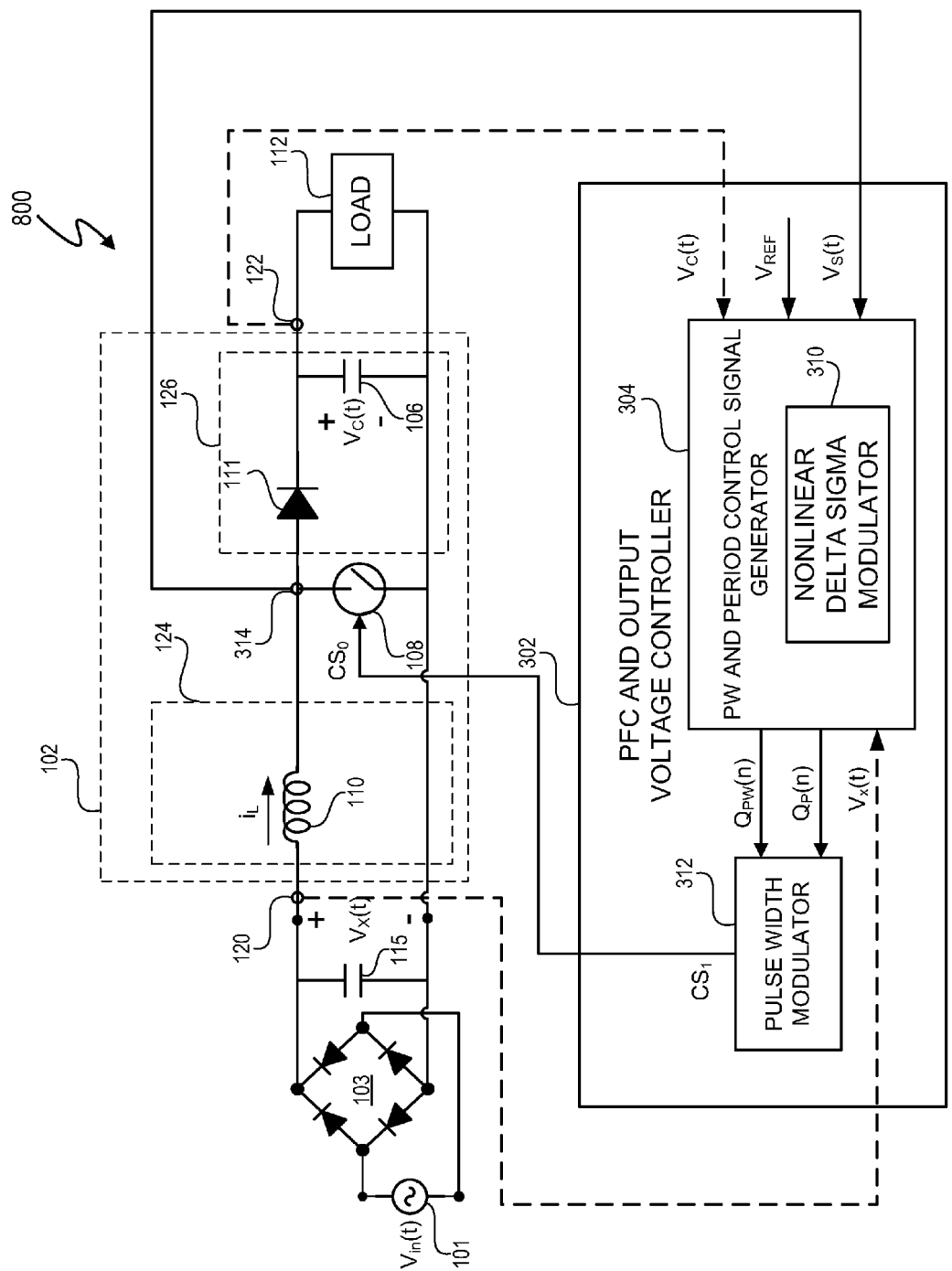
FIG. 8 depicts an embodiment of the power control system of FIG. 3
Figure 13:
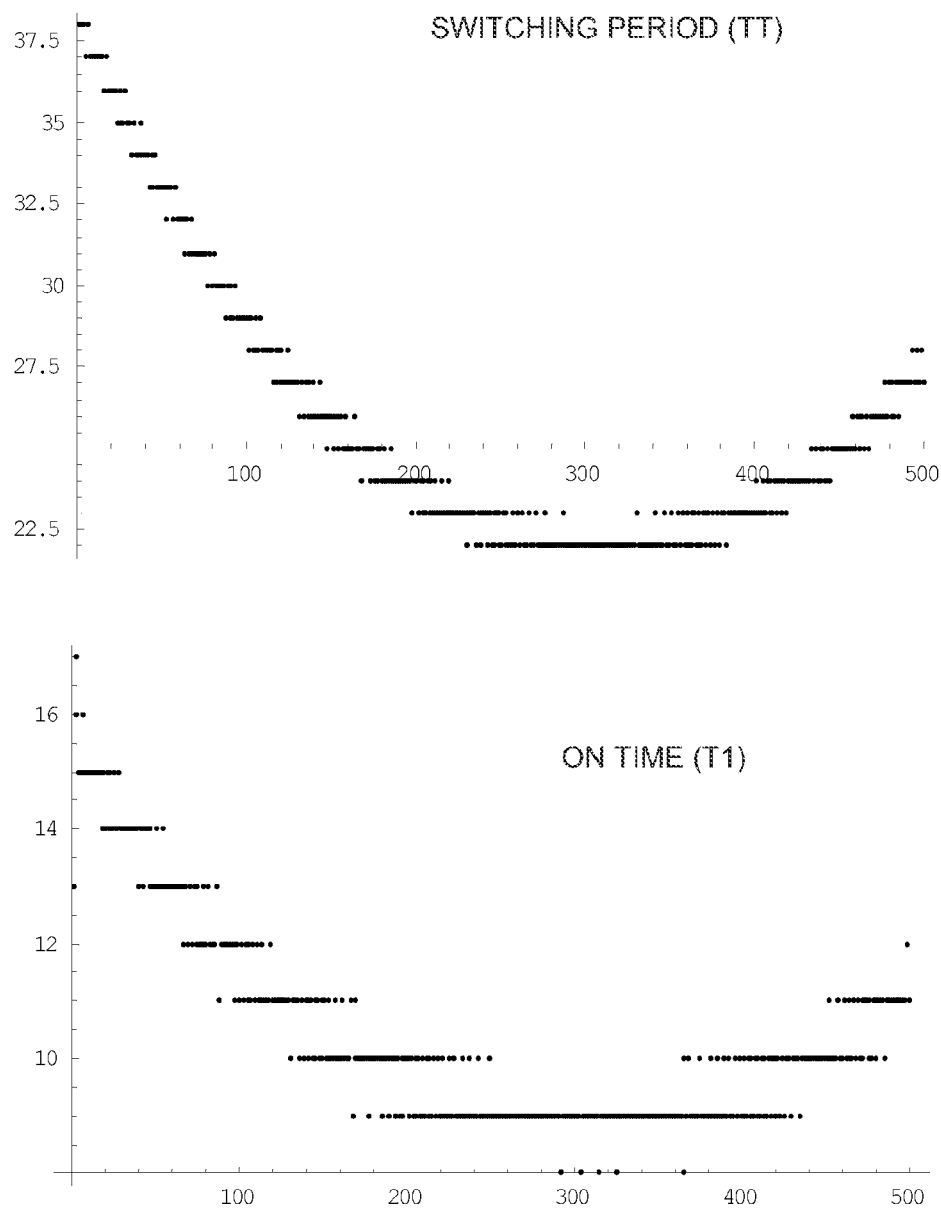
Figure 14:
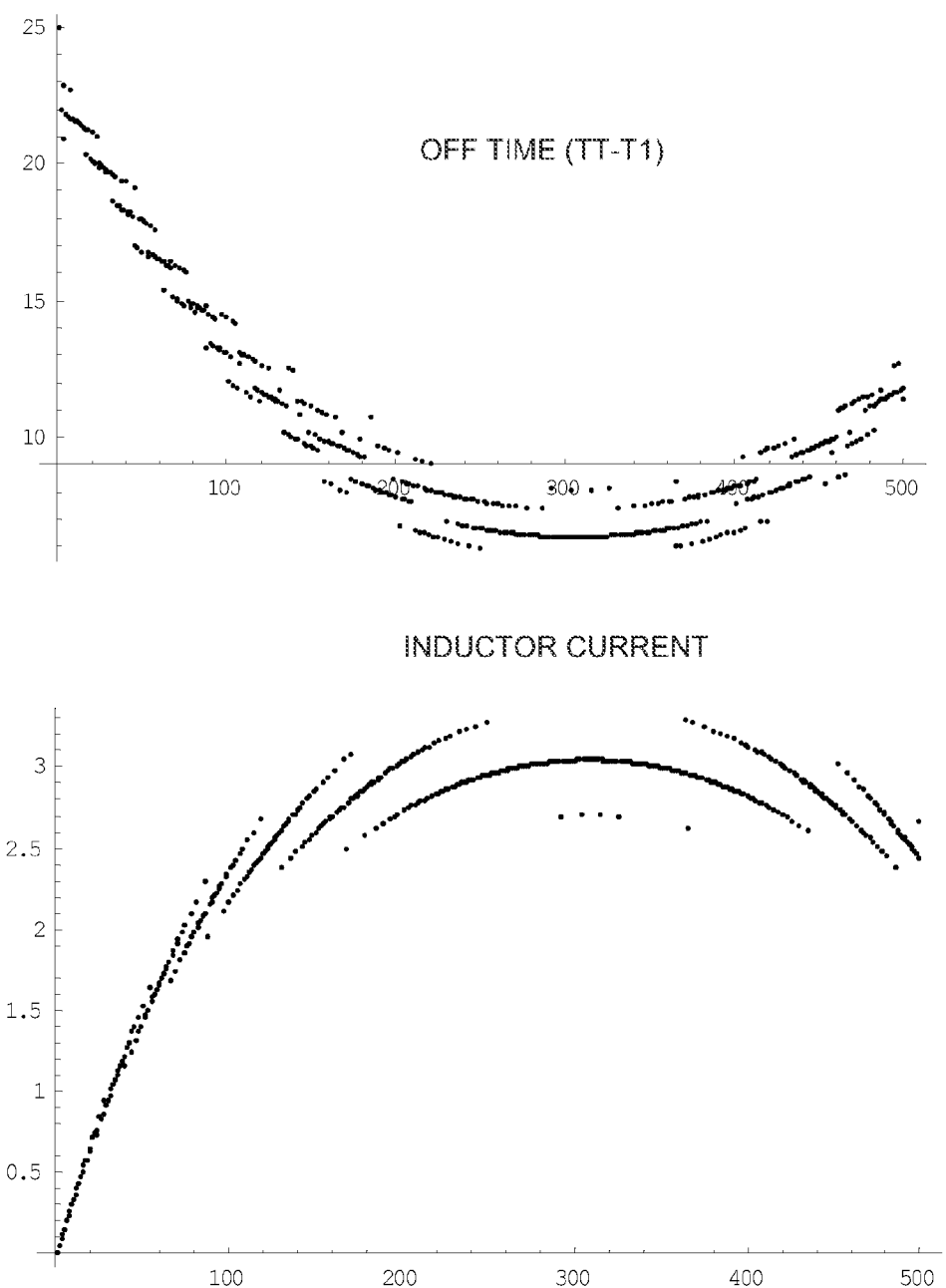
Figure 16:
Figure 19:
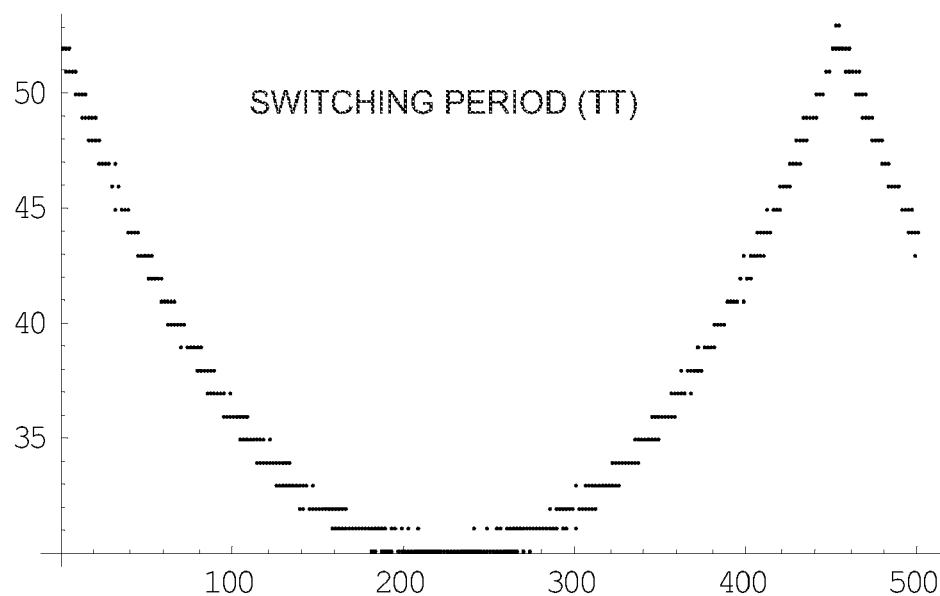
Figure 22:
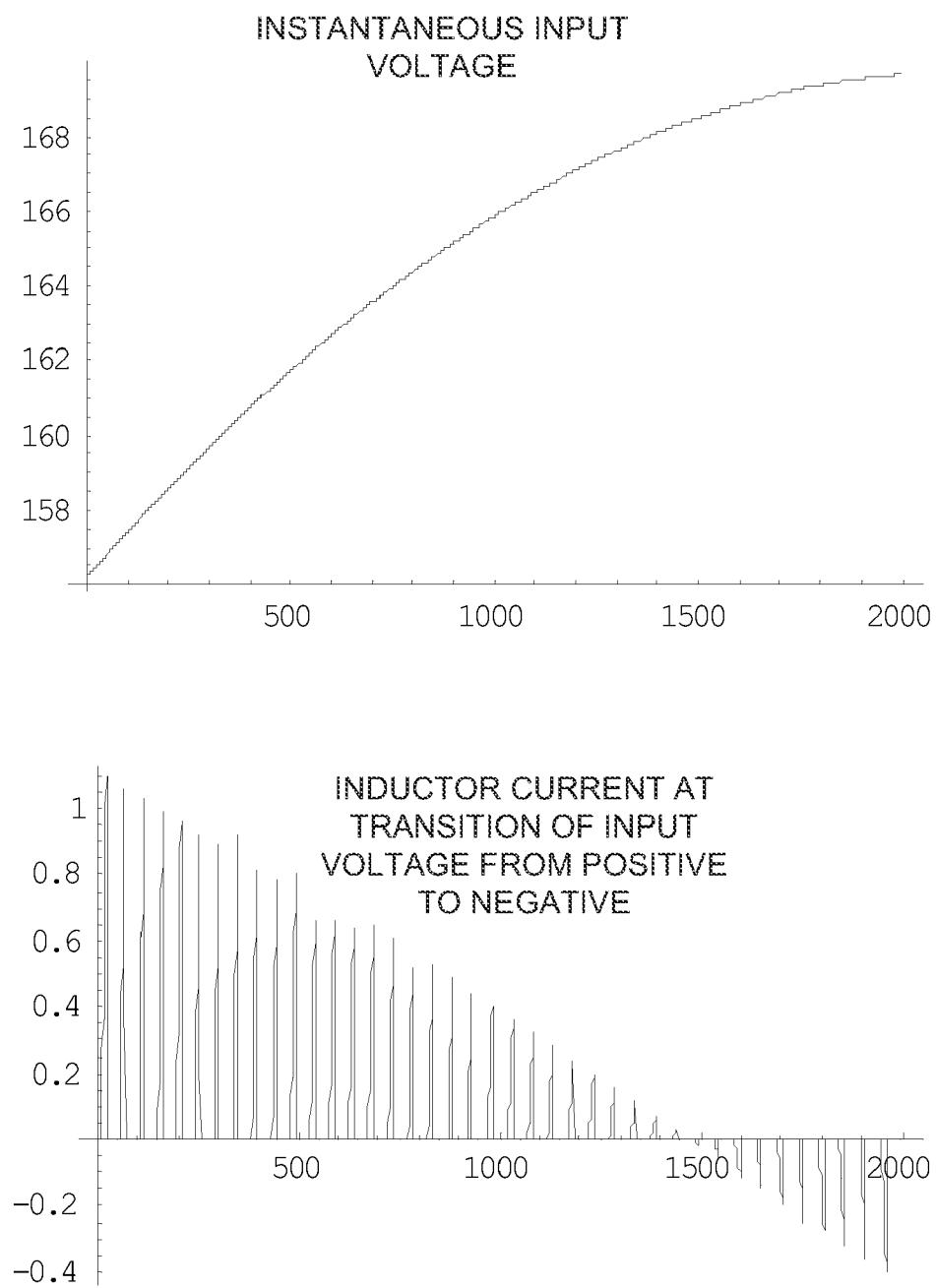
Figure 23:
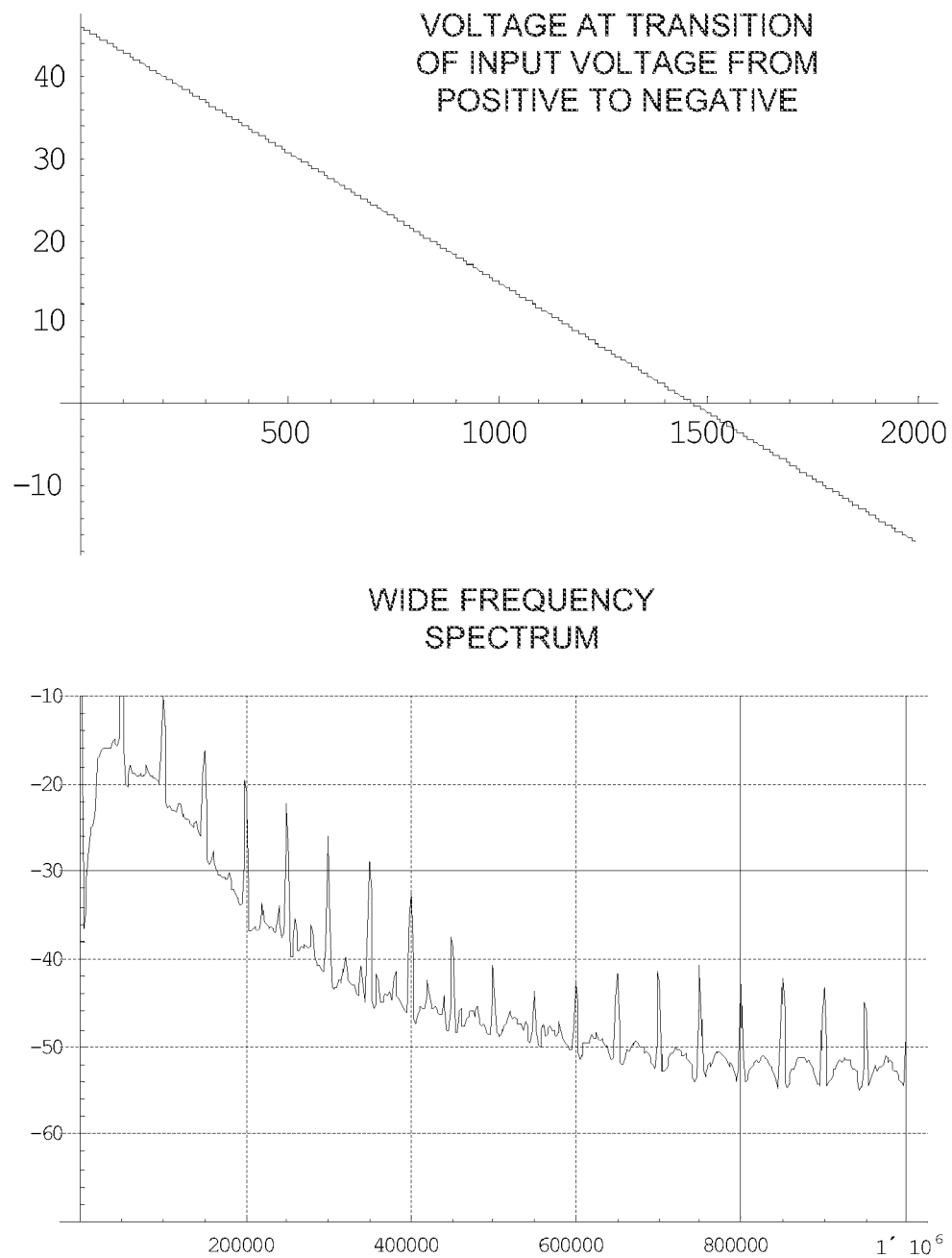
Figure 26:
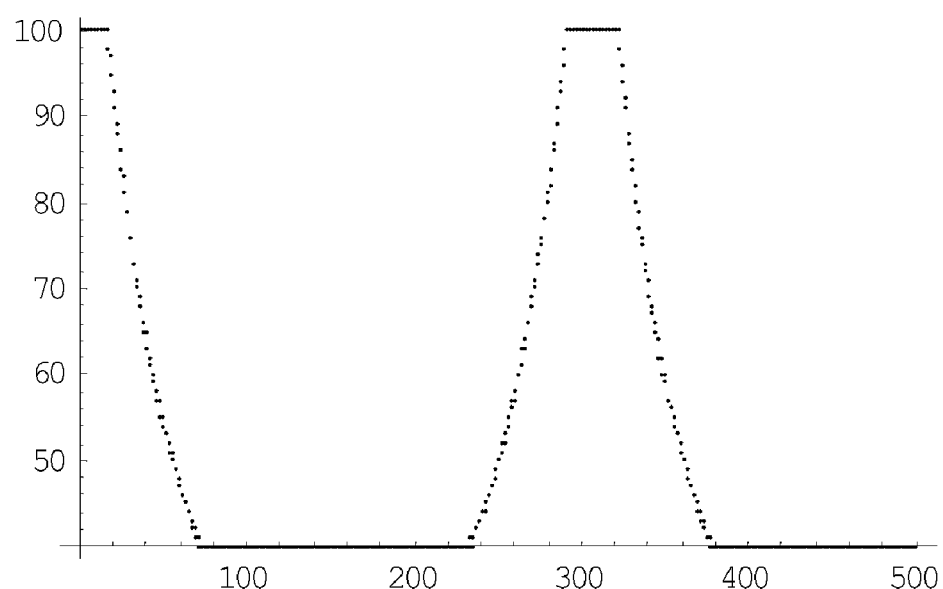
Figure 27:
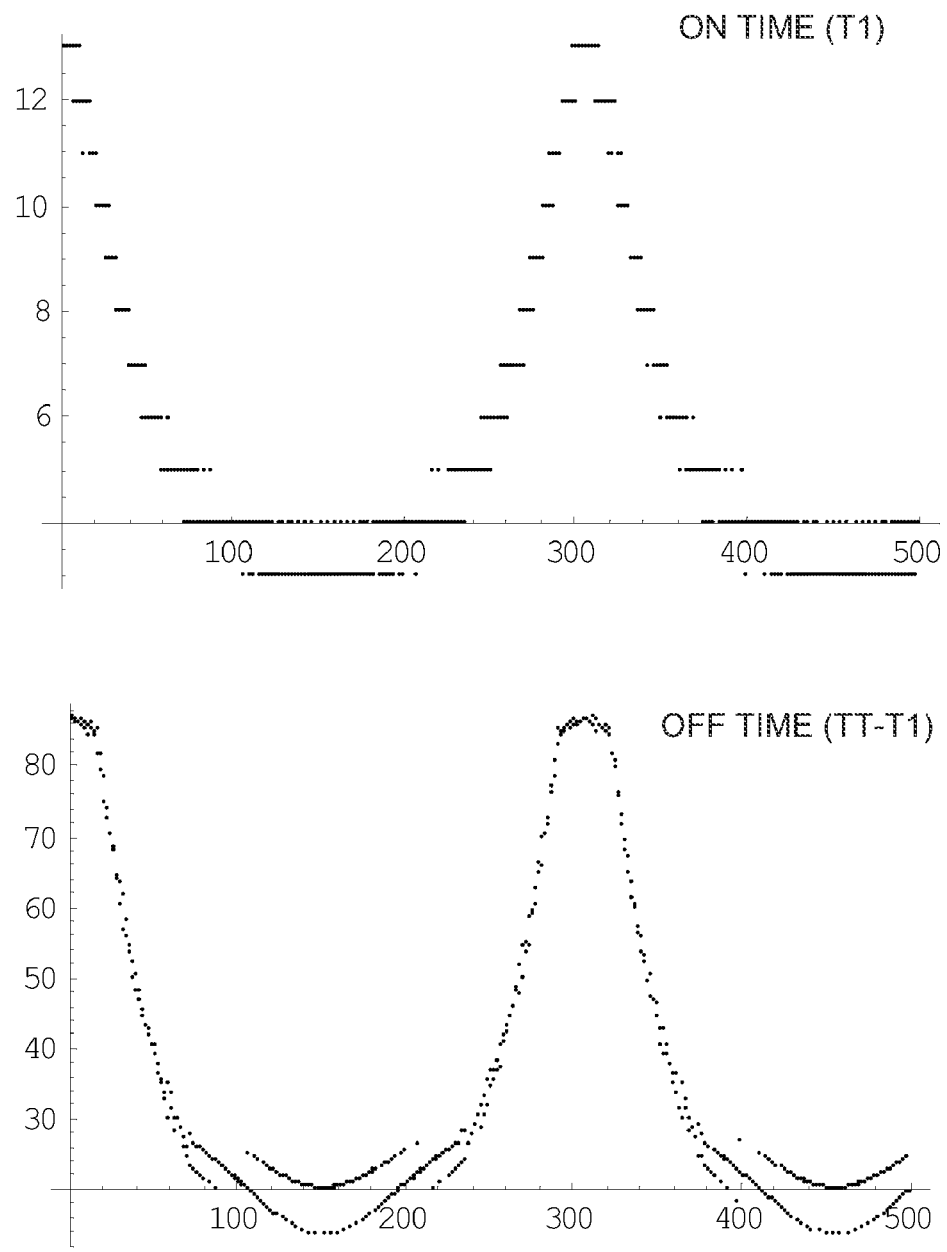
Figure 30:
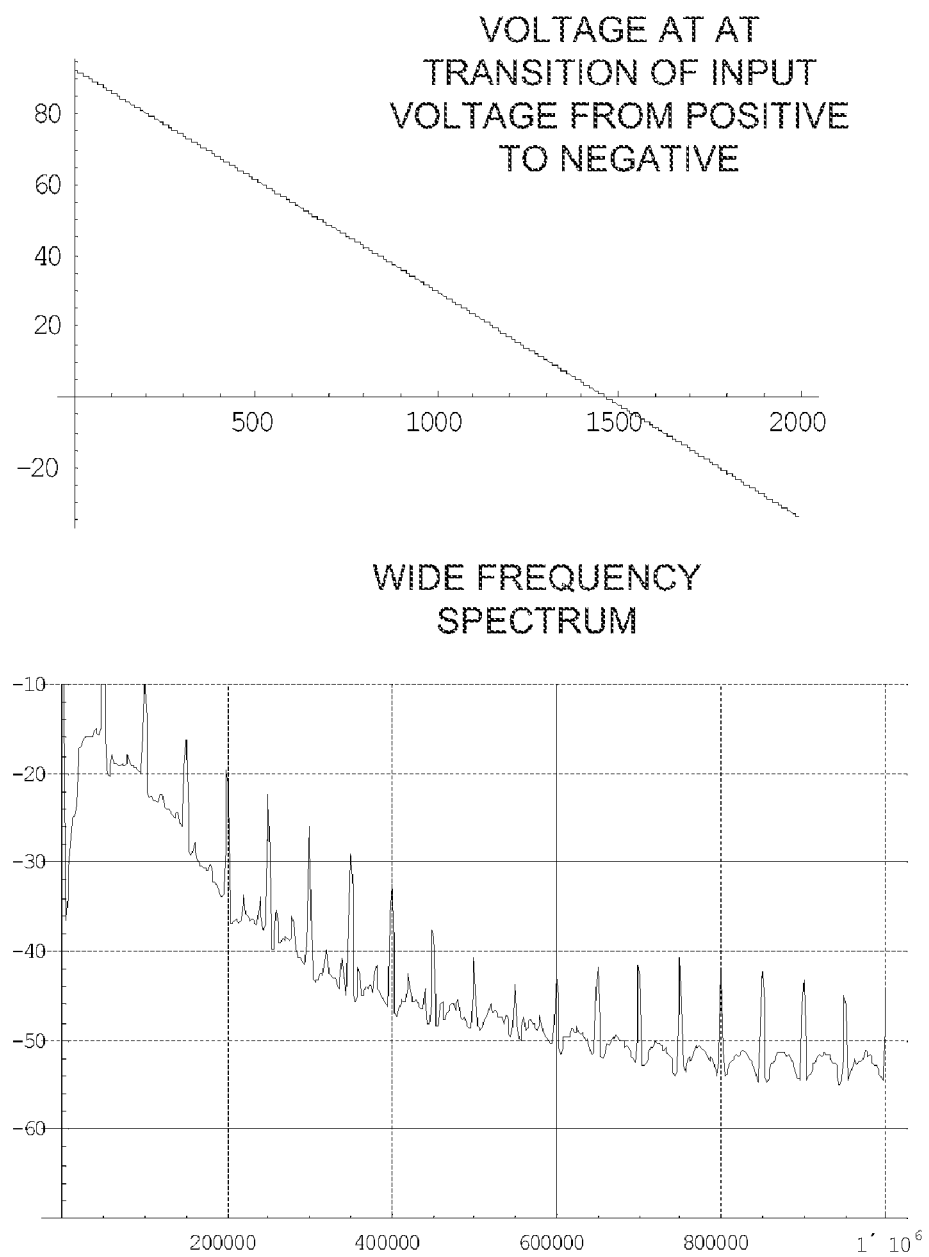

The nonlinear portion of the energy transfer process is associated with the energy provided to an input inductor in the PFC stage, such as inductor 110 (FIG. 8). Thus, the nonlinear delta-sigma modulator 310 is associated with power factor correction. The pulse width of the control signal $CS_1$ and the relation of the pulse width to the period of control signal $CS_1$, i.e. the duty cycle of control signal $CS_1$, controls power factor correction. Accordingly, the nonlinear delta-sigma modulator 310 is used by pulse width control system 406 to spectrally noise shape the pulse width control signal T1. The nonlinear delta-sigma modulator 310 generates the pulse width control signal $Q_{PW}(n)$ as a quantizer output signal. By removing the influence of noise from a baseband of control signal $CS_1$, the control signal $CS_1$ exercises improved control over switching power converter 306.

Figure 5:
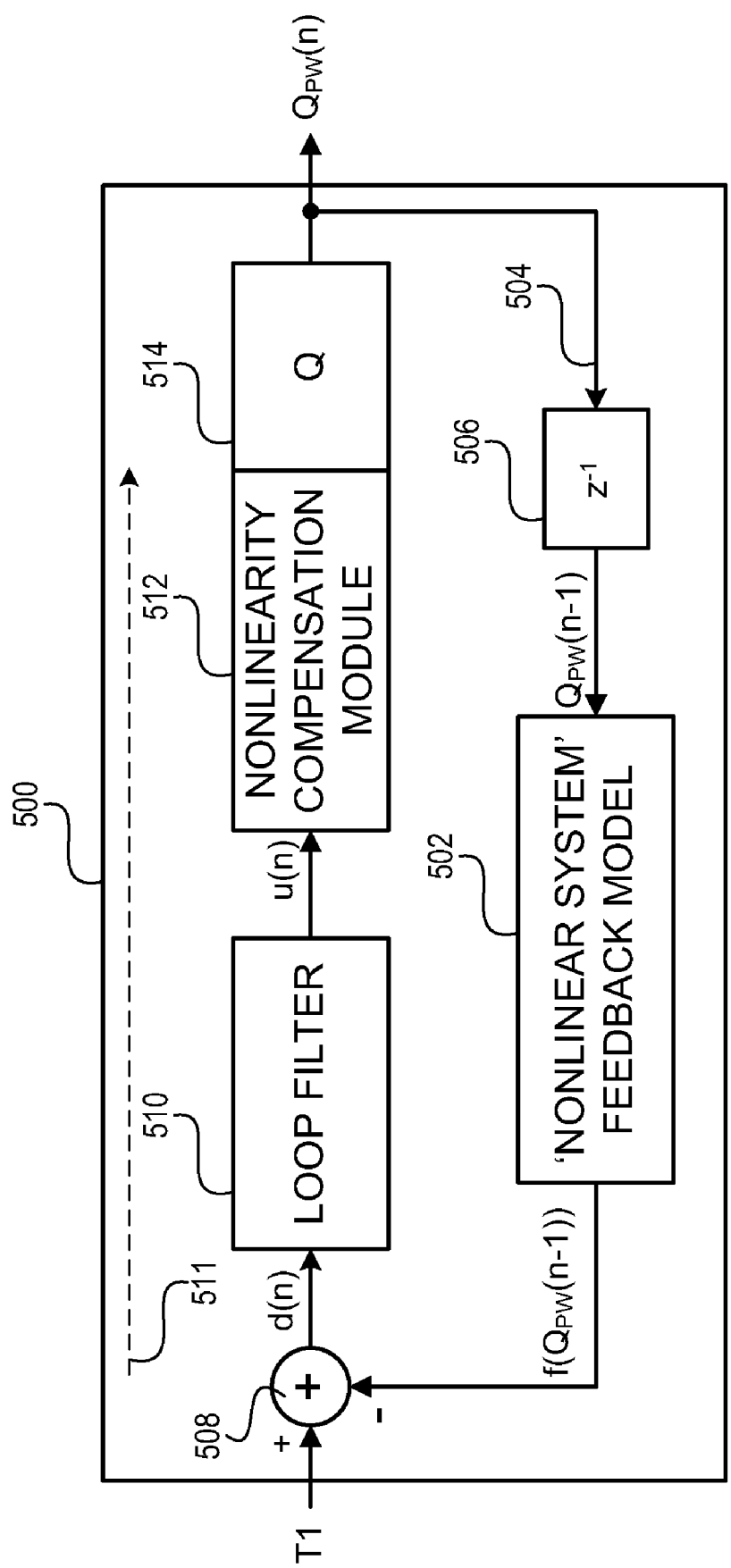
FIG. 5 depicts an embodiment of the nonlinear delta-sigma modulator of FIGS. 3 and 4.

FIG. 5 depicts a nonlinear delta-sigma modulator 500, which is one embodiment of nonlinear delta-sigma modulator 310. The nonlinear delta-sigma modulator 500 includes a 'nonlinear system' feedback model 502 in a feedback path 504 of nonlinear delta-sigma modulator 500. The feedback model 502 models nonlinearities of a nonlinear process, such as the nonlinear energy transfer process of switching power converter 306. In at least one embodiment, the feedback model 502 is represented by f(x). The pulse width control signal $Q_{PW}(n)$ is fed back through a delay 506, and the feedback model 502 processes the delayed quantizer output signal $Q_{PW}(n-1)$ in accordance with $f(Q_{PW}(n-1))$. The error generator 508 determines a difference signal d(n) representing a difference between the feedback model 502 output $f(Q_{PW}(n-1))$ and pulse width control signal T1. A $k^{th}$ order loop filter 510 filters the difference signal d(n) to generate a loop filter output signal u(n), where k is an integer greater than or equal to one and the value of k is a design choice. Generally, increasing values of k decrease baseband noise and increase out-of-band noise.

The nonlinear delta-sigma modulator 500 includes a non-linearity compensation module 512. However, in at least one embodiment, a nonlinearity compensation module is not included as part of the nonlinear delta-sigma modulator 500. The nonlinearity compensation module 512 compensates for nonlinearities introduced by the nonlinear feedback model 502. In at least one embodiment, the nonlinearity compensation module 512 processes the loop filter output signal u(n) using a compensation function of approximately $f^1(x)$, which is an inverse of the feedback model 502 function f(x), e.g. if $f(x)=x^2$, then $f^1(x)=\sim x^{1/2}$. Quantizer 514 quantizes the output of compensation module 512 to determine pulse width control signal $Q_{PW}(n)$. In at least one embodiment, the compensation function $f^1(x)$ of compensation module 512 is an estimate of the inverse of the nonlinear system feedback model 502. In at least one embodiment, the compensation function $f^1(x)$ in the forward path 511 of nonlinear delta-sigma modulator 500 provides good noise shaping across all frequencies. In at least one embodiment, an imperfect compensation function, i.e. approximate $f^1(x)$, allows more noise at all frequencies. In at least one embodiment, the compensation function $f^1(x)$ provides stability to nonlinear delta-sigma modulator 500.

In at least one embodiment, the nonlinearity compensation module 512 is incorporated as part of the quantizer 514 rather than as a process separate from a quantization process. The compensation module 512 causes the quantizer 514 to quantize the loop filter output signal u(n) in accordance with a quantization compensation function. In at least one embodiment, the quantizer compensation function determines pulse width control signal $Q_{PW}(n)$ in accordance with a derivative df(x) of the feedback model 502. For example, if the nonlinear system feedback model 502 function f(x) equals $x^2$, then the quantizer compensation function is 2x. The quantizer compensation function can be estimated as x. Decision points of the quantizer 514 are then $x+/-\frac{1}{2}$.

Figure 6:
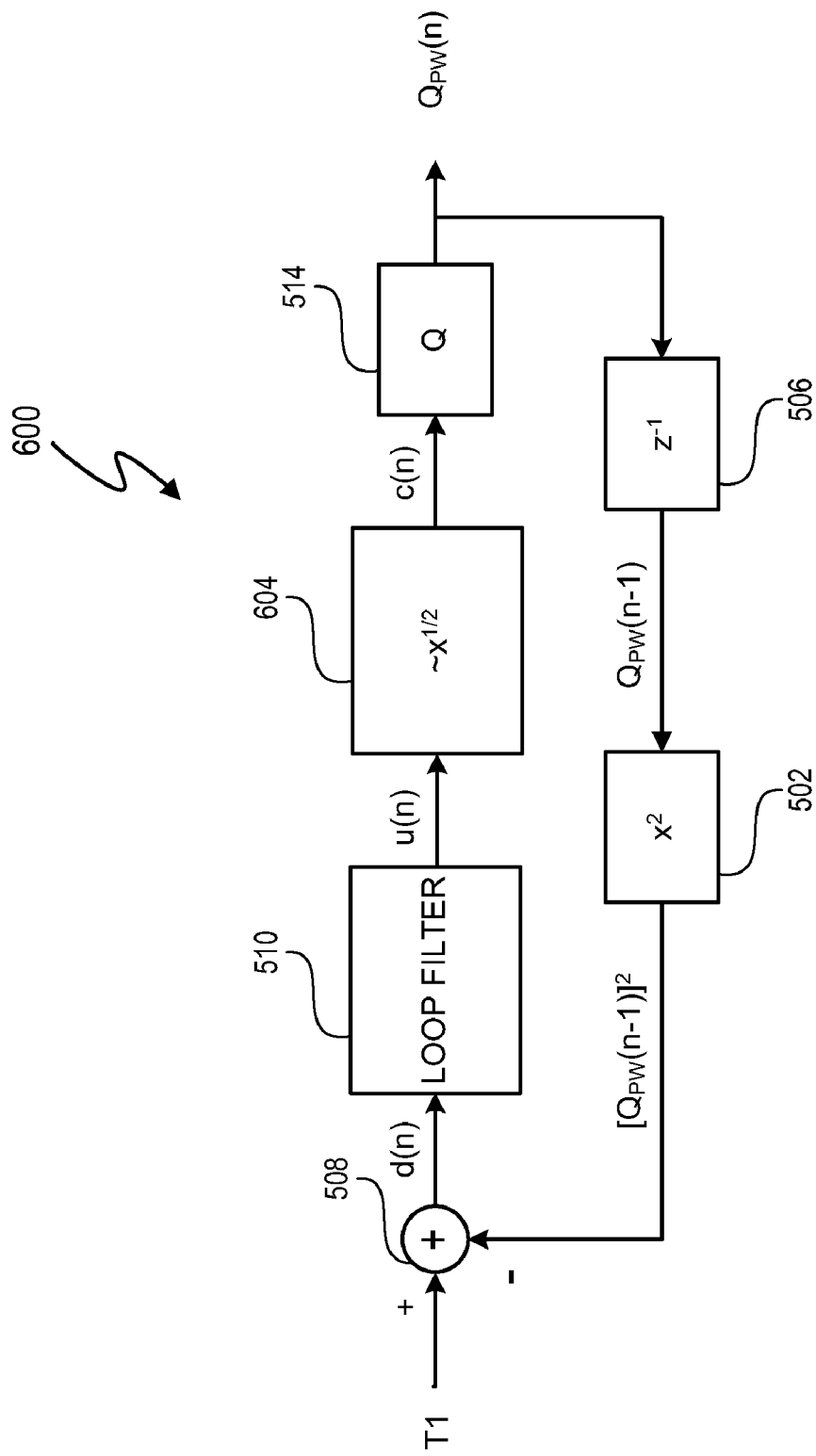
FIG. 6 depicts an embodiment of the nonlinear delta-sigma modulator of FIGS. 3, 4, and 5.

FIG. 6 depicts nonlinear delta-sigma modulator 600, which represents one embodiment of nonlinear delta-sigma modulator 310. The nonlinear energy transfer process of switching power converter 306 can be modeled as a square function, $x^2$. Nonlinear delta-sigma modulator 600 includes a nonlinear system feedback model 602 represented by $x^2$. The nonlinear system feedback model represents one embodiment of nonlinear system feedback model 502. Thus, the output of feedback model 602 is the square of the delay-by-one quantizer output signal $Q_{PW}(n)$, i.e. $[Q_{PW}(n-1)]^2$. The nonlinear delta-sigma modulator 600 operates in the same manner as nonlinear delta-sigma modulator 300 and includes a compensation module 604 that is separate from quantizer 314. The nonlinearity compensation module 604 processes output signal u(n) of the loop filter 310 with a square root function $x^{1/2}$. The output c(n) of compensation module 604 is quantized by quantizer 514 to generate quantizer output signal $Q_{PW}(n)$.

Figure 7:
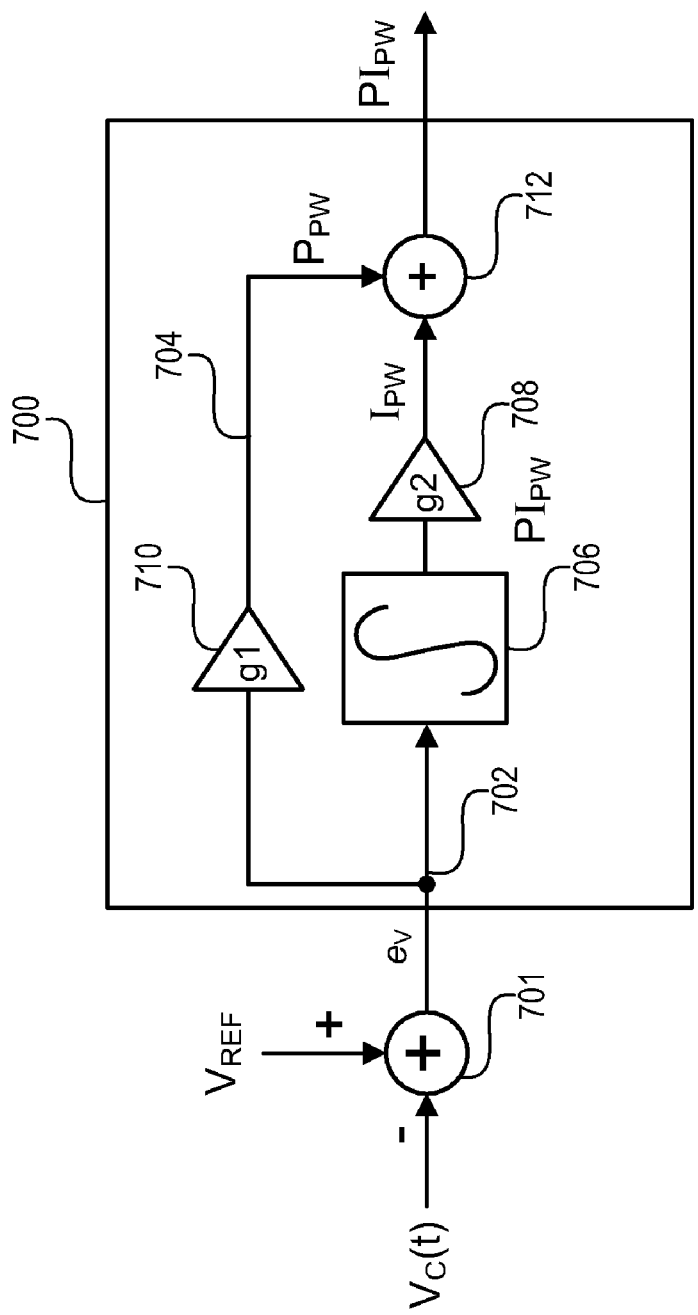
FIG. 7 depicts a proportional integrator.

FIG. 7 depicts a proportional integrator 700, which represents one embodiment of proportional integrator 412. The proportional integrator 700 generates the PI output signal $PI_{PW}$. The $PI_{PW}$ varies as the difference between the reference voltage $V_{REF}$ and the output voltage $V_c(t)$, as represented by error signal $e_v$ from error generator 701, varies. The difference between the The proportional integrator 700 includes an integral signal path 702 and a proportional signal path 704. The integral signal path includes an integrator 706 to integrate the error signal $e_v$, and a gain module 708 to multiple the integral of error signal $e_v$ by a gain factor g2 and generate the integrated output signal $I_{PW}$. The proportional path 704 includes a gain module 710 to multiply the error signal $e_v$ by a gain factor g1 and generate the proportional output signal $P_{PW}$. Adder 712 adds the integrated output signal $I_{PW}$ and the proportional output signal $P_{PW}$ to generate the PI signal $PI_{PW}$. The values of gain factors g1 and g2 are a matter of design choice. The gain factors g1 and g2 affect the responsiveness of PFC and output voltage controller 400. Exemplary values of gain factors g1 and g2 are set forth in the emulation code of FIGS. 8-31. Faster response times of the PFC and output voltage controller 400 allow the control signal $CS_1$ to more rapidly adjust to minimize the error signal $e_v$. As previously stated, if the response is too slow, then the output voltage $V_c(t)$ may fail to track changes in power demand of load 112 and, thus, fail to maintain an approximately constant value. If the response is too fast, then the output voltage $V_c(t)$ may react to minor, brief fluctuations in the power demand of load 112. Such fast reactions could cause oscillations in PFC and output voltage controller 400, damage or reduce the longevity of components, or both. Thus, the particular rate of response by proportional integrator 412 is a design choice.

FIG. 8 depicts power control system 800, which represents one embodiment of power control system 300. Power control system includes a switching power converter 102, which is identical to the switching power converter of power control system 100. In power control system 800, PFC and output voltage controller 302 controls power factor correction and output voltage regulation of switching power converter 102.

FIG. 9-31 depict a Mathematica® program that emulates power control system 800 and includes graphs depicting emulation results. The Mathmatica® program is available from Wolfram Research, Inc. with office in Champaign, Ill.

Thus, a PFC and output voltage controller includes a nonlinear delta-sigma modulator that models the nonlinear energy transfer process of a switching power converter. The nonlinear delta-sigma modulator generates an output signal used to determine the control signal. By using the nonlinear delta-sigma modulator in a control signal generation process, the PFC and output voltage controller generates a spectrally noise shaped control signal. In at least one embodiment, noise shaping of the control signal improves power factor correction and output voltage regulation relative to conventional systems.

Thus, the nonlinear delta-sigma modulator includes a feedback model that models a nonlinear process being controlled and facilitates spectral shaping to shift noise out of a baseband in a spectral domain of a response signal of the nonlinear process.

Although the present invention has been described in detail, it should be understood that various changes, substitutions and alterations can be made hereto without departing from the spirit and scope of the invention as defined by the appended claims.

What is claimed is:

1. A power factor correction controller comprising:
   a processor to receive and process one or more switching power converter feedback signals and generate a pulse width control signal using each processed feedback signal; and
   a pulse width modulator, coupled to the signal processor, having an input to receive the pulse width control signal and generate a pulse width modulated, power factor correction (PFC) control signal to control a switch that controls a power factor correction stage of the switching power converter;

wherein a pulse width of the PFC control signal varies approximately with a square root of the PWM control signal.

2. The power factor correction stage of claim 1 wherein the processor comprises a nonlinear delta-sigma modulator that includes a quantizer, a loop filter, and a feedback path coupled between the quantizer and the loop filter, and the feedback path includes a square process that generates a square of quantizer output signals.

3. The power factor correction stage of claim 1 wherein the processor is configured to process each of the feedback signals to track a function associated with variations of a time-varying voltage input signal to the switching power converter.

4. The power factor correction stage of claim 3 wherein the PFC control signal includes a period, and the pulse width modulator is configured to modulate the period of the PFC control signal to track a function associated with variations of a time-varying voltage output signal of the switching power converter.

5. The power factor correction stage of claim 3 wherein the pulse width modulator is configured to determine a period of the PFC control signal in accordance with a root mean square of the time-varying voltage input signal to the switching power converter.

6. The power factor correction stage of claim 3 wherein the pulse width modulator is configured to modulate a period of the PFC control signal in accordance with variations in a load coupled to the switching power converter.

7. The power factor correction stage of claim 1 wherein the pulse width modulator is configured to include random modulations over time to periods of the PFC control signal.

8. The power factor correction stage of claim 1 wherein the processor is configured to process each of the feedback signals to track a function associated with variations of a time-varying output voltage of the switching power converter.

9. The power factor correction stage of claim 1 wherein the pulse width modulator is configured to generate a digital pulse width modulated power factor correction (PFC) control signal.

10. The power factor correction stage of claim 1 wherein the processor is further configured to process the one or more feedback signals of the power converter to control a period of the PFC control signal.

11. A method of controlling power factor correction of a switching power converter, the method comprising:
  receiving one or more switching power converter feedback signals;
  processing each received feedback signal;
  generating a pulse width control signal using each processed feedback signal; and
  generating a pulse width modulated, power factor correction (PFC) control signal to control a switch that controls a power factor correction stage of the switching power converter;
  wherein a pulse width of the PFC control signal varies approximately with a square root of the PWM control signal.

12. The method of claim 11 wherein generating a pulse width control signal using each processed feedback signal further comprises:
  generating the pulse width control signal using a nonlinear delta-sigma modulator that includes a quantizer, a loop filter, and a feedback path coupled between the quantizer and the loop filter, and the feedback path includes a square process that generates a square of quantizer output signals.

13. The method of claim 11 further comprising:
  processing each of the feedback signals to track a function associated with variations of a time-varying voltage input signal to the switching power converter.

14. The method of claim 11 wherein the PFC control signal includes a period, the method further comprising:
  modulating the period of the PFC control signal to track a function associated with variations of a time-varying voltage output signal of the switching power converter.

15. The method of claim 11 further comprising:
  determining a period of the PFC control signal in accordance with a root mean square of the time-varying voltage input signal to the switching power converter.

16. The method of claim 11 further comprising:
  modulating a period of the PFC control signal in accordance with variations in a load coupled to the switching power converter.

17. The method of claim 11 further comprising:
  randomly modulating periods of the PFC control signal.

18. The method of claim 11 further comprising:
  processing each of the feedback signals to track a function associated with variations of a time-varying output voltage of the switching power converter.

19. The method of claim 11 further comprising:
  generating a digital pulse width modulated power factor correction (PFC) control signal.

20. The method of claim 11 further comprising:
  processing the one or more feedback signals of the power converter to control a period of the PFC control signal.

21. An apparatus to control power factor correction of a switching power converter, the apparatus comprising:
  means for receiving one or more switching power converter feedback signals;
  means for generating a pulse width control signal using each processed feedback signal; and
  means for generating a pulse width modulated, power factor correction (PFC) control signal to control a switch that controls a power factor correction stage of the switching power converter;
  wherein a pulse width of the PFC control signal varies approximately with a square root of the PWM control signal.

* * * * *